(12) United States Patent
Tateishi

(10) Patent No.: US 7,544,264 B2
(45) Date of Patent: Jun. 9, 2009

(54) ORGANIC ELECTROLUMINESCENT DEVICE AND ITS PRODUCTION METHOD

(75) Inventor: Tomomi Tateishi, Kanagawa-ken (JP)

(73) Assignee: Fujifilm Corporation, Tokyo (JP)

( * ) Notice: Subject to any disclaimer, the term of this patent is extended or adjusted under 35 U.S.C. 154(b) by 382 days.

(21) Appl. No.: 10/926,078

(22) Filed: Aug. 26, 2004

(65) Prior Publication Data

US 2005/0045269 A1 Mar. 3, 2005

(30) Foreign Application Priority Data

Aug. 29, 2003 (JP) ............................. 2003-308030

(51) Int. Cl.
- *B44C 1/175* (2006.01)
- *B44C 1/16* (2006.01)
- *B29C 65/56* (2006.01)
- *B29C 65/70* (2006.01)
- *B32B 37/10* (2006.01)
- *B32B 37/14* (2006.01)
- *G03C 8/50* (2006.01)
- *G03C 8/32* (2006.01)
- *B29C 65/02* (2006.01)
- *B32B 37/02* (2006.01)
- *G03C 8/02* (2006.01)

(52) U.S. Cl. ..................... 156/237; 156/228; 156/232; 156/240; 156/290; 156/387; 156/553; 430/200

(58) Field of Classification Search ................. 156/240, 156/244.16, 277, 387, 244.27, 228, 232, 156/553, 290, 234, 237; 430/200, 201
See application file for complete search history.

(56) References Cited

U.S. PATENT DOCUMENTS

| | | | |
|---|---|---|---|
| 6,207,268 B1 * | 3/2001 | Kosaka et al. | 428/325 |
| 6,284,307 B1 * | 9/2001 | Fukuzawa et al. | 427/66 |
| 2002/0149315 A1 * | 10/2002 | Blanchet-Fincher | 313/504 |
| 2003/0008224 A1 * | 1/2003 | Fujita et al. | 430/17 |
| 2003/0221763 A1 * | 12/2003 | Tateishi et al. | 156/67 |
| 2008/0075921 A1 * | 3/2008 | Tateishi | 428/141 |

FOREIGN PATENT DOCUMENTS

WO    WO 00/41893 A1    7/2000

* cited by examiner

*Primary Examiner*—Philip C Tucker
*Assistant Examiner*—Sonya Mazumdar
(74) *Attorney, Agent, or Firm*—Birch, Stewart, Kolasch & Birch, LLP

(57) ABSTRACT

An organic electroluminescent device is produced by a method using a transfer material comprising a pressing member having a projection and an organic layer formed on the projection, which comprises the steps of superposing the transfer material on a first substrate having an electrode formed at least partially thereon such that the organic layer faces the electrode; applying pressure thereto to form a laminate; and peeling the pressing member from the laminate so that the organic layer is transferred onto the first substrate via the electrode.

6 Claims, 7 Drawing Sheets

ORGANIC ELECTROLUMINESCENT DEVICE AND ITS PRODUCTION METHOD

This Non-provisional application claims priority under 35 U.S.C. § 119(a) on Patent Application No(s). 2003-308030 filed in Japan on Aug. 29, 2003, the entire contents of which are hereby incorporated by reference.

FIELD OF THE INVENTION

The present invention relates to an organic electroluminescent device (including an organic light-emitting device) useful for full-color display devices, backlights, illumination surface light sources, light source arrays of printers, etc., and a method for producing the same.

BACKGROUND OF THE INVENTION

Much attention is paid to organic electroluminescent devices usable for flat panel display devices. Specifically, the organic electroluminescent devices are promising as inexpensive, solid-emission-type, large-emission-area, full-color display devices and writing light source arrays, and their development has been actively conducted. The organic light-emitting device generally comprises a couple of electrodes (a transparent electrode and a rear-surface electrode), and one or more organic layers containing a light-emitting layer formed between the electrodes. When an electric field is applied to the electrodes, electrons are injected into the light-emitting layer from one electrode, while holes are injected thereinto from the other electrode. With electrons and holes recombined in the light-emitting layer, energy is emitted as light when an energy level is lowered from a conduction band to a valence band.

WO 00/41893 discloses a method for thermally transferring an organic layer and a photo-thermal conversion layer onto a substrate by a laser beam by using a donor sheet having the organic layer and the photo-thermal conversion layer. However, such a thermal transfer method is disadvantageous in that a gas often penetrates into the interface between the organic layer and the substrate. The light-emitting efficiency, durability, and emission uniformity of the organic electroluminescent device depend on the conditions of the interface. Thus, an organic electroluminescent device produced by this method shows poor light-emitting properties when a gas penetrates into the interface.

In the case of transferring an organic layer from a donor onto a substrate by thermal writing in a predetermined pattern using a thermal head or a laser common in printing technologies, a temperature distribution generated around the organic layer pattern due to thermal diffusion blurs the pattern outline, failing to cut the pattern from the donor accurately. Thus, organic electroluminescent devices produced by the method are uneven in light emission and likely to suffer from poor durability, because of insufficient electric connection and the breakage of the organic layer. Further, yield is likely to be low because of low-accuracy positioning of the substrate and the thermal head or laser beam.

As methods of forming a patterned organic layer, relief dyeing methods, pigment dispersion methods, electrodeposition methods, vacuum deposition methods, ink-jet methods, and offset printing methods have been proposed. The relief dyeing methods comprise the steps of forming a predetermined pattern of a photoresist on an organic layer, and soaking a substrate having the organic layer in a dye solution. In the pigment dispersion methods, a pigment is dispersed in a photoresist, applied onto a substrate, exposed, and developed to form a pattern. In the electrodeposition methods, a predetermined pattern is formed on an electrode by electrodeposition. In the case of forming patterned organic layers containing different-color-emitting materials on a substrate in these methods, the different-color layers are formed by repeating the steps. The methods are thus costly and unsuitable for mass production.

In a case where a large-area, organic electroluminescent device is produced by a vacuum deposition method, which comprises disposing a mask between an organic layer and a deposition source to thermally deposit a light-emitting material in a pattern, the mask is likely to be deformed by heating. Further, the mask needs to be washed in vacuum, or to be separated, washed, and then placed under vacuum again, whereby the method is unsuitable for mass production. In the ink-jet methods and the offset printing methods, it is difficult to select solvents for stacking organic layers containing the light-emitting materials, and the stacked organic layers are mixed at the interfaces to reduce the light-emitting efficiency and the durability of the organic electroluminescent device.

OBJECTS OF THE INVENTION

Accordingly, an object of the present invention is to provide a method for easily forming patterned organic layers on a substrate without mixing of the organic layers at the interfaces, thereby producing an organic electroluminescent device excellent in light-emitting efficiency and durability.

Another object of the present invention is to provide an organic electroluminescent device obtained by such a method.

SUMMARY OF THE INVENTION

As a result of intense research in view of the above object, the inventor has found that an organic layer can be formed in a desired pattern on a substrate by forming a patterned projection on one surface of a pressing member; forming an organic layer on the projection side of the pressing member to prepare a transfer material; superposing the transfer material on a substrate having an electrode formed at least partially such that the organic layer faces the electrode side; applying pressure thereto to form a laminate; and peeling the pressing member from the laminate. The present invention has been accomplished by this finding.

Thus, the method of the present invention for producing an organic electroluminescent device uses a transfer material comprising a pressing member with a projection and at least one organic layer formed on the projection side, comprising the steps of superposing the transfer material on a first substrate having an electrode formed at least partially thereon such that the organic layer faces the electrode side; applying pressure thereto to form a laminate; and peeling the pressing member from the laminate so that the organic layer is transferred onto the first substrate via the electrode.

Preferred embodiments of the method of the present invention are as follows.
(1) A top surface of the projection preferably has a maximum surface roughness Rmax (JIS B 0601-1982) of at most 0.5 times the thickness of the organic layer.
(2) A flat layer is preferably formed on the projection.
(3) The substrate may be entirely or partially covered with the electrode.
(4) After the transfer of the organic layer onto the first substrate, a second substrate having an electrode formed at least partially thereon may be laminated to the transferred organic layer on the first substrate.

(5) The flat layer preferably comprises at least one material selected form the group consisting of ultraviolet-curing organic compounds, electron beam-curing organic compounds, thermosetting organic compounds, inorganic oxides and inorganic nitrides.

(6) The pressing member preferably comprises a material having a linear thermal expansion coefficient of 20 ppm/° C. or less.

(7) The transfer material is preferably produced by applying a coating liquid containing a compound for the organic layer to the pressing member.

(8) The transfer material is preferably produced by vacuum-depositing a compound for the organic layer onto the pressing member.

An organic electroluminescent device of the present invention is obtained by the method of the present invention.

DETAILED DESCRIPTION OF THE PREFERRED EMBODIMENTS

Figure 1A:
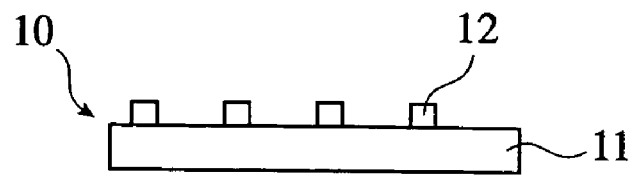
FIGS. 1(a) to 1(c) are views showing an example of the production of a transfer material, FIG. 1(a) showing a pressing member, FIG. 1(b) showing application of a coating liquid to a pressing member, and FIG. 1(c) showing a transfer material.
Figure 1B:
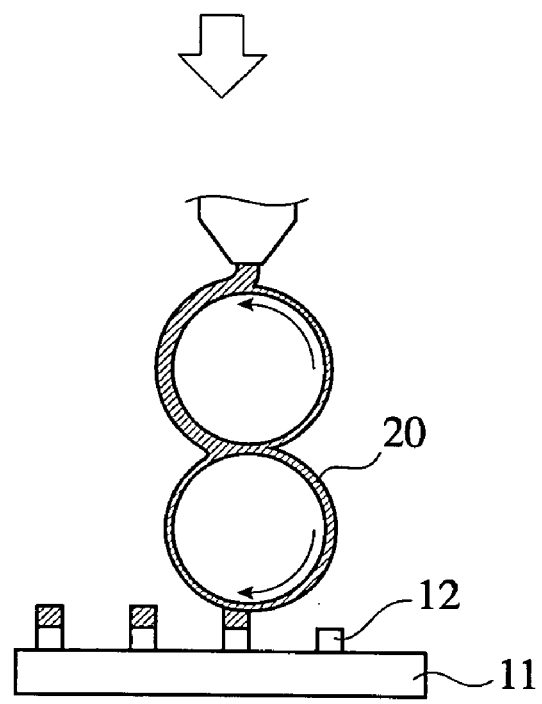
Figure 1C:
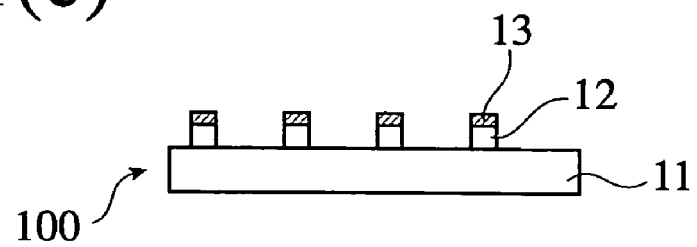

[1] Method for Producing Organic Electroluminescent Device

In the method of the present invention for producing an organic electroluminescent device, a transfer material is prepared by forming an organic layer on a projection of a pressing member, superposed on a substrate such that the organic layer of the transfer material faces the coating surface (electrode) on the substrate, and pressed and/or heated to form a patterned organic layer on the substrate.

(1) Patterning of Organic Layer

FIGS. 1(a) to 1(c) and 2(a) to 2(d) shows an example of forming patterned organic layers for three colors on a substrate by the method of the present invention. A pressing member 10 shown in FIG. 1(a) comprises a plate body 11 and projections 12 formed in a pattern on the plate body 11. An organic layer coating liquid 20 containing a compound for an organic layer is applied to the projections 12 of the pressing member 10 by a roller coating method, whereby the coating liquid 20 is adhered to the projections 12 (see FIG. 1(b)). An organic layer 13 is formed on the pressing member 10 by drying the applied coating liquid 20, to obtain a first transfer material 100 (see FIG. 1(c)).

Figure 2A:
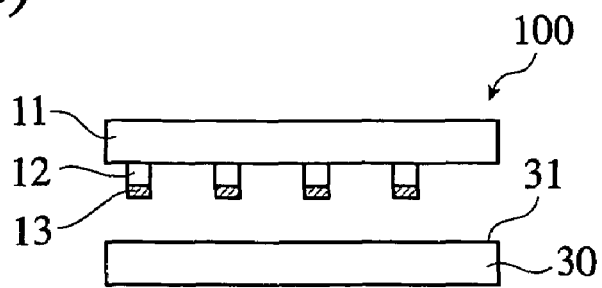
FIGS. 2(a) to 2(d) are views showing an example of transfer of an organic layer onto a substrate, FIG. 2(a) showing the transfer material facing the substrate, FIG. 2(b) showing the transfer material superposed on the substrate, FIG. 2(c) showing an organic layer formed on the substrate, and FIG. 2(d) showing a three-color organic layer formed on the substrate.
Figure 2B:
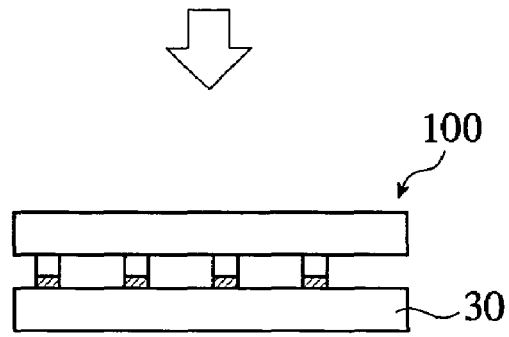
Figure 2C:
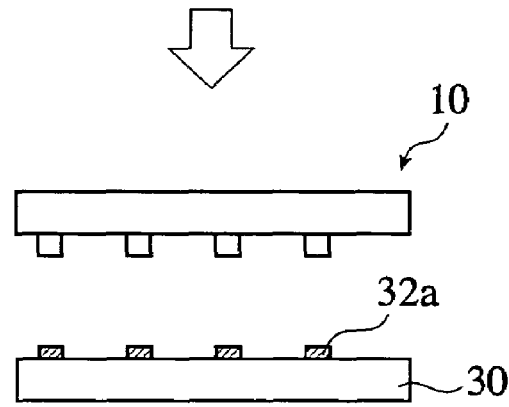

The transfer material 100 is positioned such that the organic layer 13 faces a coating surface 31 of a substrate 30 as shown in FIG. 2(a), superposed on the substrate 30 as shown in FIG. 2(b), and heated and/or pressed. The pressing member 10 is peeled and removed, so that a patterned, first organic layer 32a is formed on the substrate 30 (see FIG. 2(c)).

Figure 2D:
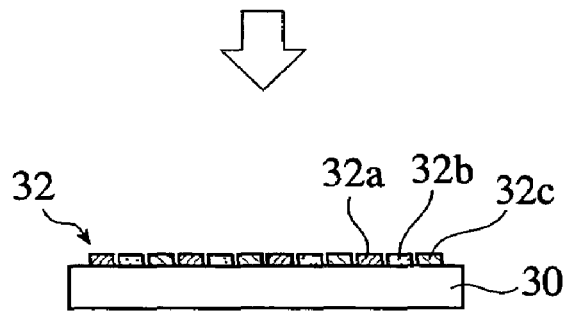

A three-color, patterned, organic layer 32 can be formed on the substrate 30 by positioning and forming a second organic layer 32b and a third organic layer 32c in the same manner as the first organic layer 32a except for changing the color of the layer (see FIG. 2(d)).

Figure 3A:
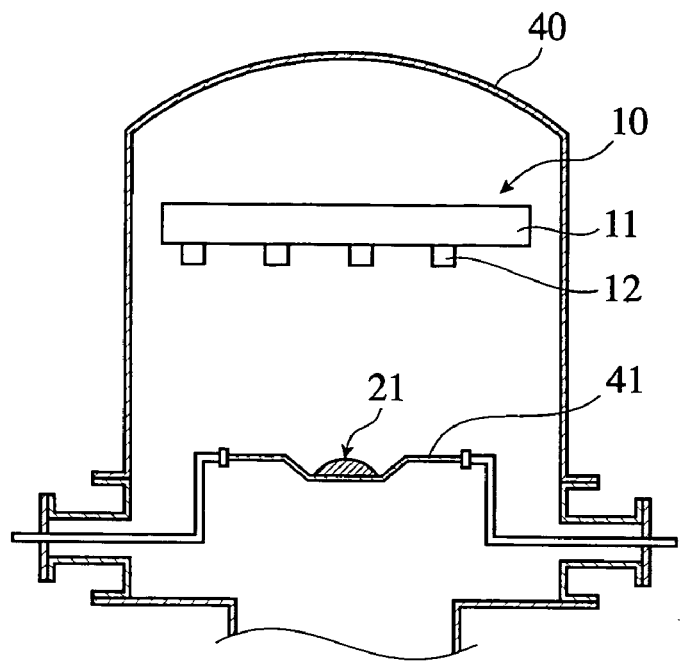
FIGS. 3(a) and 3(b) are views showing another example of the production of a transfer material, FIG. 3(a) showing a pressing member and a composition for an organic layer placed in a vacuum chamber, and FIG. 3(b) showing the organic layer formed on the projection side of the pressing member.
Figure 3A:
Figure 3B:
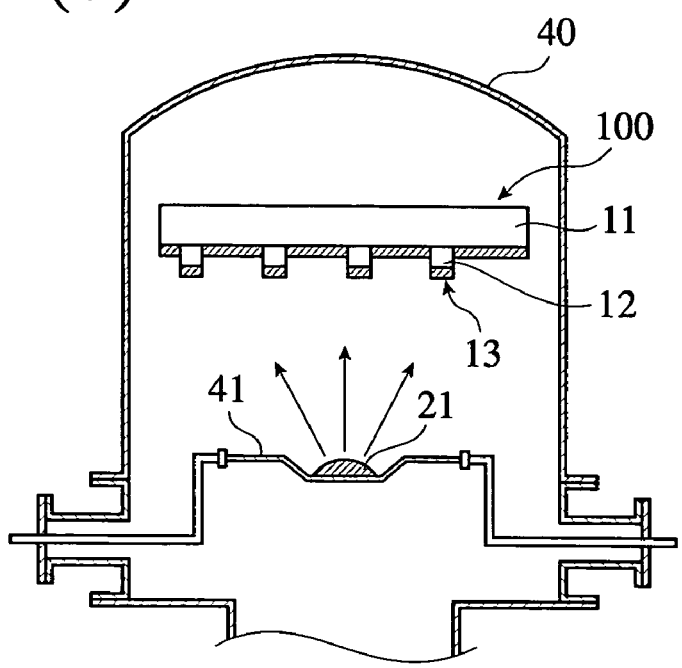

The organic layer 13 may be formed on the pressing member 10 by a vacuum deposition method. A vacuum deposition apparatus shown in FIG. 3(a) comprises a vacuum chamber (bell jar) 40 and a target holder 41, which is connected to a heating apparatus (not shown). A composition 21 containing a light-emitting material is placed in the target holder 41, and the pressing member 10 is placed separately from the composition 21 such that the projections 12 of the pressing member 10 face the composition 21. After the inner pressure of the vacuum chamber 40 is reduced, the target holder 41 is heated, whereby the composition 21 is evaporated and deposited onto the projection side of the pressing member 10 to form the organic layer 13 (see FIG. 3(b)).

Figure 4A:
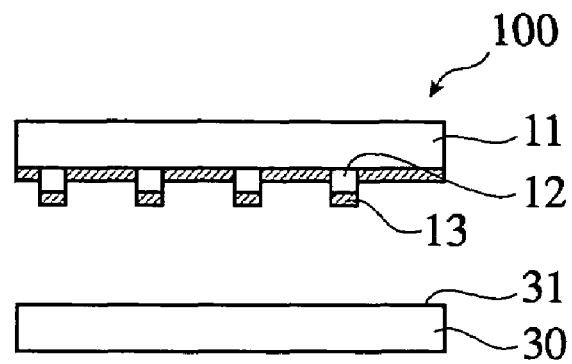
FIGS. 4(a) to 4(c) are views showing another example of transfer of an organic layer onto a substrate, FIG. 4(a) showing the transfer material facing the substrate, FIG. 4(b) showing the transfer material superposed on the substrate, and FIG. 4(c) showing the organic layer transferred onto the substrate.
Figure 4B:
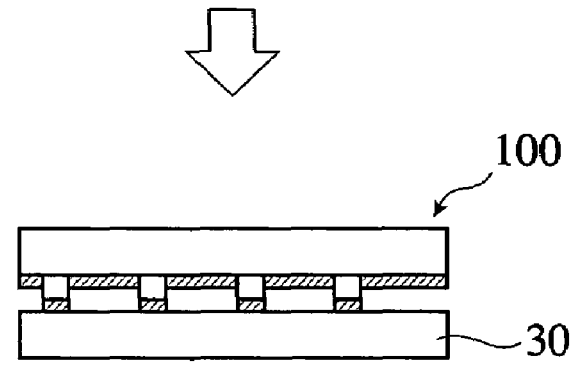
Figure 4C:
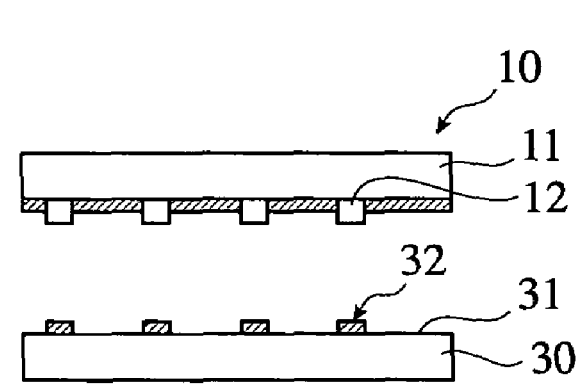

The transfer material 100 is positioned such that the organic layer 13 faces a coating surface 31 of a substrate 30 as shown in FIG. 4(a), superposed on the substrate 30 as shown in FIG. 4(b), and heated and/or pressed. The pressing member 10 is peeled and removed, so that an organic layer 32 is transferred onto the substrate 30 (see FIG. 4(c)). Though the organic layer 13 is formed not only on the projections 12 of the pressing member 10 but on the entire surface of the projection side, the transfer material 100 is superposed on the substrate 30 such that only the portions of the organic layer 13 formed on the projections 12 are brought into contact with the coating surface 31. Thus, only the portions are transferred to the coating surface 31 to form the patterned organic layer 32.

(2) Peeling Transfer Method

In the peeling transfer method, the organic layer softened by heating and/or pressing the transfer material is laminated to the coating surface of the substrate, and the pressing member is separated from the organic layer, so that only the organic layer remains on the coating surface.

Figure 5:
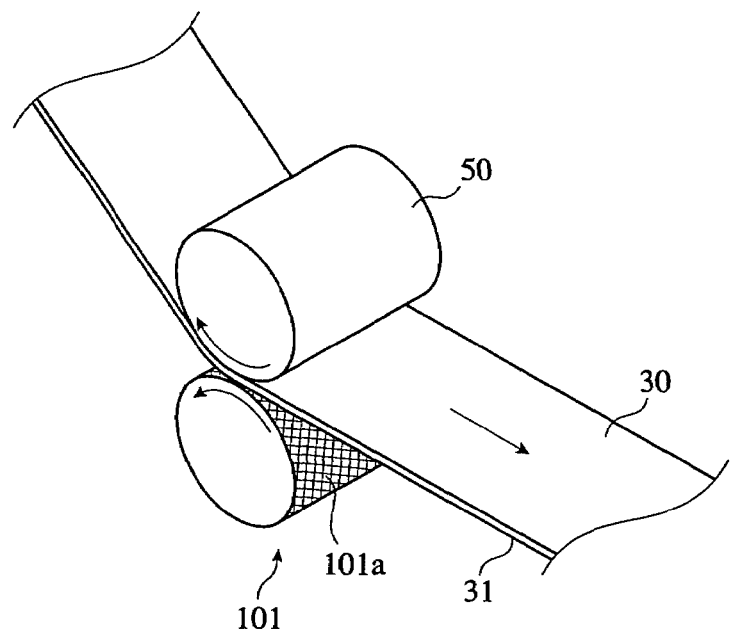
FIG. 5 is a perspective view showing an example of transfer of an organic layer onto a substrate by peeling.

FIG. 5 shows an example of the transfer of an organic layer 101a of a transfer material 101 onto a substrate 30. In this example, the transfer material 101 is a roll having the organic layer 101a outside. The substrate 30 is sandwiched between the transfer material 101 and a heating roller 50, and a coating surface 31 of the substrate 30 faces the transfer material 101. When the substrate 30 is passed between the transfer material 101 and the heating roller 50 while heating the substrate 30 by the heating roller 50, the patterned organic layer 101*a* of the transfer material 101 is transferred onto the substrate 30.

Figure 6:
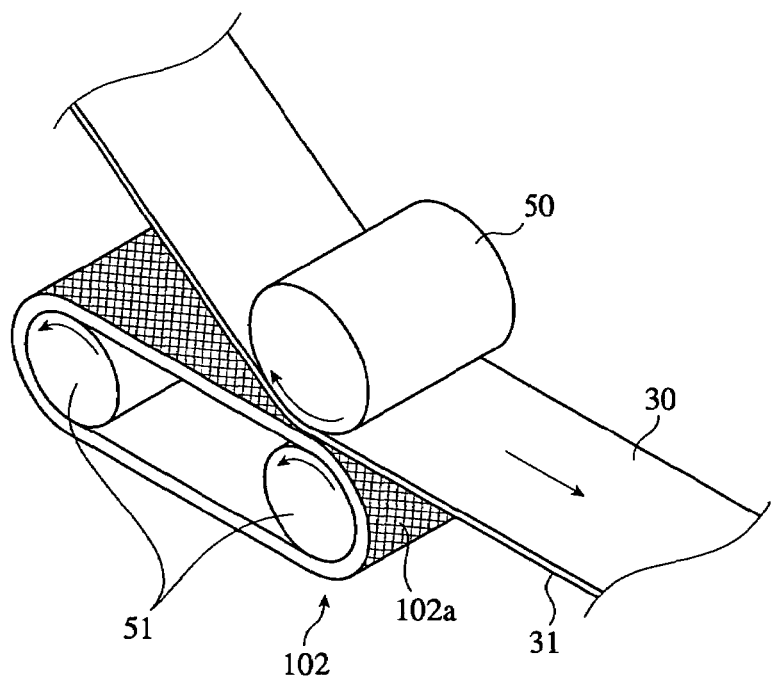
FIG. 6 is a perspective view showing another example of transfer of an organic layer onto a substrate by peeling.

FIG. 6 shows an example of the transfer of an organic layer 102*a* of a sheet-like transfer material 102 onto a substrate 30. The transfer material 102 is supported by a couple of rollers 51, and has the organic layer 102*a* outside. The substrate 30 and the transfer material 102 are sandwiched between a heating roller 50 and the rollers 51, and a coating surface 31 of the substrate 30 faces the organic layer 102*a* of the transfer material 102. When the substrate 30 and the transfer material 102 are passed between the heating roller 50 and the rollers 51 while heating the substrate 30 by the heating roller 50, the organic layer 102*a* of the transfer material 102 is transferred onto the substrate 30.

The pressure for transferring the organic layer may be changed depending on the materials of the organic layer and the pressing member. The transfer pressure is preferably 0 to 10 t/cm$^2$, more preferably 0 to 5 t/cm$^2$, and particularly 0 to 2 t/cm$^2$. The preferred transfer pressure range relates to the pressure resistances of the pressing member, the transfer material and the substrate, and may be increased as the pressure resistances increase. It is preferred that the transfer material is pressed and heated simultaneously.

The transfer material may be heated by a common method using a laminator, an infrared heater, a thermal head, a hot plate, a pressing apparatus, etc. First Laminator VA-400III available from Taisei Laminator K. K., a thermal head for thermal transfer printing, a hot plate pressing apparatus, etc. may be used as the laminator. The transfer temperature may be changed depending on the materials of the organic layer and the heating member. The transfer temperature is preferably 40 to 250° C., more preferably 50 to 200° C., particularly 60 to 180° C. The preferred transfer temperature range relates to the heat resistances of the heating member, the transfer material and the substrate, and may be elevated as the heat resistances increase. In the case of successively using a plurality of transfer materials, the transfer temperature at the preceding transferring step is preferably equal to or higher than at the following transferring step. In a case where a transfer material having plural organic layers is used such that the organic layers are successively transferred, the transfer temperature at the preceding transferring step is preferably equal to or higher than at the following transferring step.

It is preferred that the organic layer or high-molecular-weight components therein have glass transition temperatures or flow-starting temperatures of at least 40° C. and at highest the transfer temperature+40° C. In the case of transferring a plurality of organic layers, the organic layers may contain a common component.

The substrate and/or the transfer material may be preheated before the transferring step. The preheating temperature is preferably at least 30° C. and at highest the transfer temperature+20° C. The peeling temperature, at which the pressing member is peeled off, is preferably at least −50° C. and at highest the transfer temperature. After peeling the pressing member, the transferred organic layer may be heated and/or pressed.

When the transfer material is superposed on the substrate such that the organic layer faces the coating surface of the substrate, a superposing angle of the transfer material to the substrate is relatively large to reduce the inclusion of air bubbles. Further, when the pressing member is peeled from the organic layer transferred onto the substrate, a peeling angle of the pressing member to the organic layer is preferably large.

The transfer material and/or the substrate are preferably in the form of a continuous web. The transfer material used for the production of the organic electroluminescent device of the present invention comprises an organic layer formed on the pressing member. Plural organic layers having the same or different compositions may be successively formed on the pressing member.

The organic layer preferably contains a light-emitting organic compound or a carrier-transporting organic compound. The peeling transfer method may be repeated to laminate plural organic layers having the same or different compositions on the substrate. In a case where the organic layers have the same composition, voids due to poor transfer and peeling can be prevented in the resultant organic layer. The light-emitting efficiency of the organic electroluminescent device can be improved by forming organic layers having different functions. For example, a laminate of a transparent conductive layer/a light-emitting organic layer/an electron-transporting organic layer/an electron-injecting layer/a rear-surface electrode, or a laminate of a transparent conductive layer/a hole-injecting layer/a hole-transporting organic layer/a light-emitting organic layer/an electron-transporting organic layer/an electron-injecting layer/a rear-surface electrode can be formed on the coating surface of the substrate in this or opposite order by the transfer method of the present invention.

The organic layer transferred onto the substrate via the electrode or another transferred organic layer is preferably re-heated and/or re-pressed to improve adhesion between the organic layer and the substrate or between the organic layers. The re-heating temperature is preferably within a range of the transfer temperature ±50° C. The pressure applied in the re-pressing is preferably within a range of the transfer pressure ±100%.

The transferred organic layer may be surface-treated before the subsequent transferring step to improve adhesion, thereby preventing the transferred organic layer from being reversely transferred onto another organic layer, which is to be transferred onto the organic layer on the substrate in the next transferring step. Examples of such surface treatments include activation treatments such as corona discharge treatments, flame treatments, glow discharge treatments, and plasma treatments. In the case of utilizing the surface treatment, the transfer temperature at the preceding transferring step may be lower than at the following transferring step, unless the reverse transfer occurs.

An apparatus used in the method of the present invention may comprise a means for supplying the transfer material prepared by forming the organic layer on the pressing member by a wet method, etc.; a transfer means for heating and/or pressing the transfer material on the substrate to transfer the organic layer onto the coating surface of the substrate; and a means for peeling the pressing member from the transferred organic layer.

The apparatus preferably has a means for preheating the transfer material and/or the substrate before they are supplied to the transfer means. Further, the apparatus may have a cooling means downstream of the transfer means.

A means for controlling a superposing angle may be disposed upstream of the transfer means to increase the angle of the transfer material supplied onto the substrate. A peeling angle-controlling means may be disposed downstream of the transfer means or the cooling means to increase the peeling angle of the pressing member to the organic layer.

The details of the apparatus for producing the organic electroluminescent device are described in JP 2002-260854 A, Japanese Patent Application No. 2001-089663, etc.

[2] Transfer Material

The structure and components of the transfer material are described below.

(1) Structure

The transfer material comprises the pressing member and at least one organic layer formed thereon. In the case of transferring plural organic layers, a plurality of transfer materials each having an organic layer may be prepared, or alternatively a transfer material having the organic layers may be prepared. Thus, the plural organic layers may be formed on one pressing member, and such a transfer material can transfer the plural organic layers successively without changing the transfer material.

The transfer material having the plural organic layers can form a multi-layered film on the substrate by one transferring step. When the interfaces between the organic layers are not uniform, holes or electrons are unevenly transported. Thus, a method for forming the organic layers on the pressing member is carefully selected from wet methods and dry methods such as vapor deposition methods to obtain uniform interfaces.

(2) Pressing Member

The pressing member for uniformly applying pressure to the transfer material may be transparent or opaque. In the case where the position of the organic layer is controlled while observing from the pressing member to produce a multi-color device, the pressing member is preferably colorless transparent to reduce scattering and attenuation of light. Further, the pressing member is preferably composed of an inflexible material. Materials for the pressing member are not particularly limited as long as they have required physical properties. Specific examples of the pressing member include sheets of inorganic materials such as yttrium-stabilized zirconia (YSZ) and glass; metallic foils of metals such as aluminum, copper, stainless steel, gold, and silver; sheets of plastics such as polyimides, liquid crystal polymers, fluororesins (e.g. tetrafluoroethylene resins (PTFE) and trifluorochloroethylene resins (PCTFE)), polyethylene naphthalates (PEN), polycarbonates, polyether sulfones (PES), and rigid polyvinyl chlorides; laminates thereof; etc. The pressing member is preferably a glass plate, a stainless steel foil, a polyimide sheet, or a polycarbonate sheet, etc. from the viewpoints of workability and cost.

(a) Body

Figure 7A:
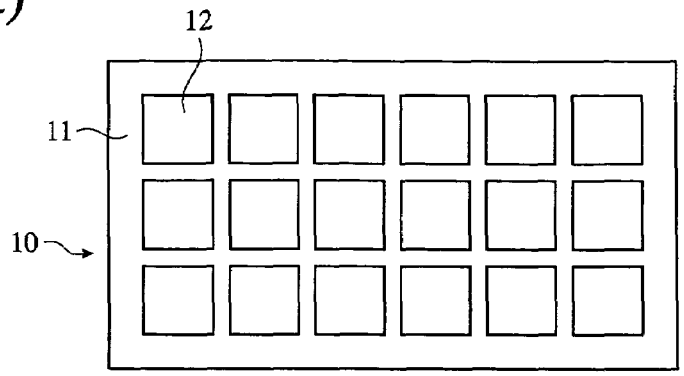
FIGS. 7(a) and 7(b) are views showing an example of a pressing member, FIG. 7(a) being a top view and FIG. 7(b) being a cross-sectional view.
Figure 7B:
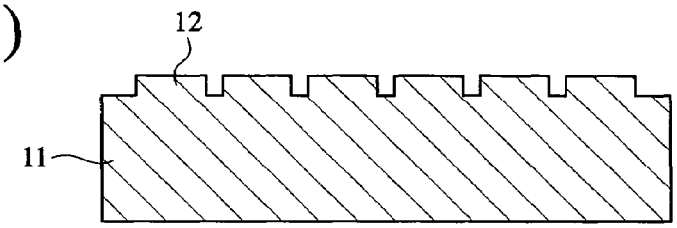

FIGS. 7(a) and 7(b) show an example of a pressing member 10 for patterning a single-color organic layer. As shown in FIGS. 7(a) and 7(b), the pressing member 10 has a plate body 11 and plural projections 12 formed on the plate body 11. The projections 12 are arranged to obtain a desired pattern of the transferred organic layer. The projections 12 have rectangular sections in this example, and the cross-sectional shape of the projections 12 is not limited thereto and may be square or trapezoid. The projections 12 preferably have a height of 0.5 to 50 μm. When the height of the projection 12 is less than 0.5 μm, also portions of the organic layer, formed outside the patterned projections, are likely to be transferred. When the height is more than 50 μm, the projection 12 is easily broken.

The shape, structure, size, etc. of the pressing member 10 are not particularly limited, and may be appropriately determined in accordance with purposes and applications of the organic electroluminescent device. The pressing member is generally in a shape of roll, plate or sheet.

The top surface of the projection in the pressing member preferably has a maximum surface roughness Rmax (according to JIS B 0601-1982) of at most 0.5 times the thickness of the organic layer. The maximum surface roughness Rmax is more preferably at most 0.25 times, particularly preferably 0.01 to 0.1 times the thickness. When the maximum surface roughness Rmax is more than 0.5 times the thickness of the organic layer, the transferred organic layer is poor in adhesion to the substrate, and the resultant organic electroluminescent device suffers from defect in light-emitting properties due to short-circuiting.

Figure 9:
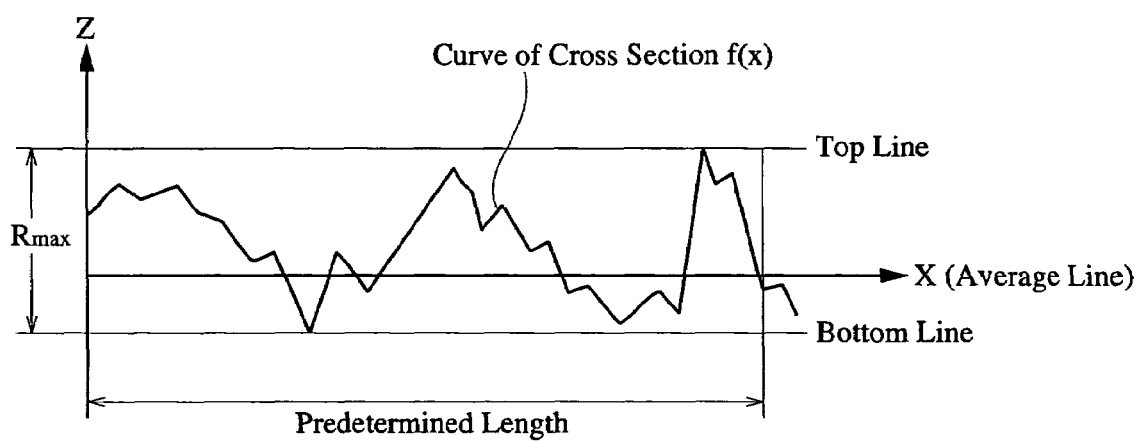
FIG. 9 is a graph showing a maximum surface roughness Rmax of a top surface of a projection in a pressing member.

As shown in FIG. 9, the maximum surface roughness Rmax according to JIS B 0601-1982 is represented by a difference in a vertical direction (Z-axis direction) between a top line passing through the highest point and a bottom line passing through the lowest point, parallel to a line X representing an average height, in a curve representing a section of the projection within a predetermined length. The maximum surface roughness Rmax may be measured by an interatomic-force microscope, a confocal microscope, a stylus method, an optical microscopic interference method, a multi-interference method, an optical cutting method, etc. The maximum surface roughness Rmax is preferably measured by an interatomic-force microscope or a confocal microscope.

The body of the pressing member preferably comprises a material having a linear thermal expansion coefficient of 20 ppm/° C. or less. The linear thermal expansion coefficient may be measured by a method of detecting the change of the length of a sample while heating and/or pressing the sample at a constant rate, such as a TMA method. When a pressing member having the linear thermal expansion coefficient of more than 20 ppm/° C. is used for forming a patterned, multi-color, organic layer, the organic layer is displaced while repeating the thermal transfer step and the cooling step.

The pressing member may be transparent or opaque, and is preferably transparent and more preferably colorless transparent. When the pressing member is colorless transparent, the position of the organic layer can be controlled while observing from the pressing member.

Examples of materials for the body of the pressing member include inorganic materials such as yttrium-stabilized zirconia (YSZ) and glass; metals such as aluminum, copper, stainless steel, gold, and silver; organic materials such as polyimides, liquid crystal polymers, fluororesins including tetrafluoroethylene resins (PTFE) and trifluorochloroethylene resins (PCTFE), polyethylene naphthalates (PEN), polycarbonates, polyether sulfones (PES), and rigid polyvinyl chlorides; and laminates thereof. Among the materials, glass, stainless steel, polyimides, and polycarbonates are preferred from the viewpoints of workability and cost.

The thickness of the pressing member is not particularly limited, and the preferred thickness range depends on the transfer pressure and the transfer temperature. In general, the thickness is preferably 5 μm to 5 m, more preferably 10 μm to 5 m, particularly 25 μm to 5 m. When the thickness of the pressing member is less than 5 μm, the portions other than the projections are so thin that the pressing member is distorted under the transfer pressure, and the organic layer in the portions other than the projections is also transferred onto the substrate, thereby failing to form a desired pattern. The pressing member with a thickness of more than 5 m requires a large producing machine.

(b) Flat Layer

Figure 8A:
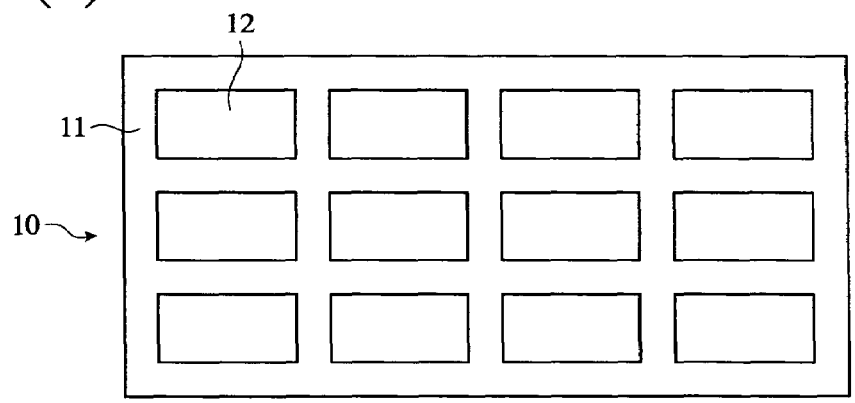
FIGS. 8(a) and 8(b) are views showing another example of a pressing member, FIG. 8(a) being a top view and FIG. 8(b) being a cross-sectional view.
Figure 8B:
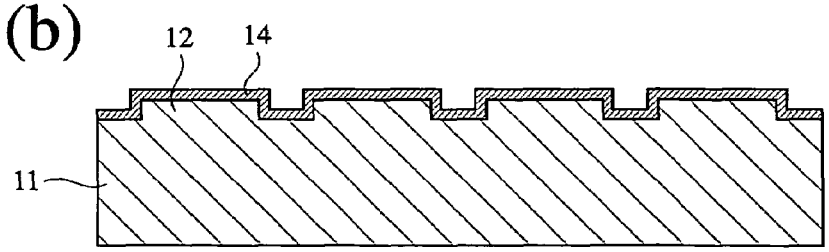

A flat layer may be formed on the projection side of the pressing member. As shown in FIGS. 8(a) and 8(b), a flat layer 14 may be uniformly formed on the projection 12 side of a pressing member 10. The thickness of the flat layer is preferably 0.05 to 50 μm, more preferably 0.1 to 20 μm, particularly 0.5 to 10 μm. When the thickness of the flat layer is more than 50 µm, the flat layer is poor in flexibility and thus easily cracked. When the thickness of the flat layer is less than 0.05 µm, the flatness of the surface, which the flat layer is formed on, is not sufficiently improved.

In the case where the body of the pressing member comprises a material having a linear thermal expansion coefficient of 20 ppm/° C. or less, it is preferred that the flat layer also comprises a material having a linear thermal expansion coefficient of 20 ppm/° C. or less. When the linear thermal expansion coefficient of the flat layer is more than 20 ppm/° C., the flat layer is easily peeled off the body by heating. Preferable plastic materials having linear thermal expansion coefficients of 20 ppm or less are polyimides and liquid crystal polymers. These plastic materials are described in detail in *Plastic Databook*, edited by "*Plastic*" Editorial Department, Asahi Kasei AMIDAS, etc.

The flat layer preferably comprises an organic compound, an inorganic oxide, or an inorganic nitride. The flat layer comprising an organic compound is preferably formed by applying a solution of a monomer to the projection side of the pressing member and by polymerizing the monomer. The monomer may be a polyfunctional compound, a polymerizable oligomer, or a polymerizable polymer, and examples thereof include prepolymers of polyesters, polyurethanes, epoxy resins, polyethers, polycarbonates, etc., which may have an acrylate group in the chain end or the side chain. Particularly preferable among them are polyesters having an acrylate group such as pentaerythritol acrylate, and polyurethanes having an acrylate group such as NK Esters U-108A and U-1001BA (trade names) available from Shin-Nakamura Chemical Co., Ltd.

The organic compound forming the flat layer is preferably a hardenable compound such as a thermosetting organic compound, an ultraviolet-curing organic compound, and an electron beam-curing organic compound. For example, the flat layer of a hardenable polymer can be formed by applying a solution containing a monomer of a hardenable compound on the projection side of the pressing member and by polymerizing the monomer.

The monomer solution may be applied by a coating method such as an extrusion coating method and a roll coating method, using a double roll coater, a slit coater, an air knife coater, a wire bar coater, a slide hopper, spray coating, a blade coater, a doctor coater, a squeeze coater, a reverse roll coater, a transfer roll coater, an extrusion coater, a curtain coater, a die coater, a gravure roll, etc.

The organic compound may be polymerized and/or hardened by heating, ultraviolet irradiation, or electron beam irradiation. In the case of polymerizing and/or hardening the organic compound by heating, common hot-air heaters, ceramic heaters, hot plates, heating rollers, laminators, hot stamps, thermal heads, laser lights, etc. may be used as a heat source. Examples of the laser lights include ion gas lasers such as argon laser and krypton laser; metal vapor lasers such as copper laser, gold laser and cadmium laser; solid lasers such as ruby laser and YAG laser; semiconductor lasers such as gallium-arsenic laser emitting light in the infrared range of 750 to 870 nm; etc. The semiconductor lasers are practically preferred from the viewpoints of the size, cost, stability, reliability, durability, and easy modulation. In the case of using laser for hardening the organic compound, a material capable of effectively absorbing the laser light is preferably added to the flat layer. When such an absorbing material is irradiated with a laser light, the material converts the light energy into thermal energy. The thermal energy is transferred to the adjacent monomer molecules to accelerate the hardening. A layer of the absorbing material may be formed between the flat layer and the pressing member.

In the case of polymerizing and/or hardening the organic compound by electron beam irradiation, it is preferred that an electron beam accelerator is used under an accelerating voltage of 100 to 1,000 kV and a one-pass absorption dose of 0.5 to 20 Mrad from the viewpoints of penetrability and hardening. The accelerating voltage is more preferably 100 to 300 KV. When the accelerating voltage or the electron beam dose is too low, electron beams are so poor in penetrability that the inside of the flat layer is not sufficiently hardened. On the other hand, when the accelerating voltage or the electron beam dose is too high, the energy efficiency and the strength of the flat layer are lowered, and the resins or the additives are likely to be decomposed. The electron beam accelerator may be an electrocurtain system, a scanning-type accelerator, a double-scanning-type accelerator, etc. When the electron beam irradiation is carried out under a too high oxygen concentration, the hardening of the electron beam-curing organic compound is prevented. Thus, the atmosphere in the irradiation apparatus is preferably replaced with an inert gas such as nitrogen, helium and carbon dioxide before the electron beam irradiation to decrease the oxygen concentration. The oxygen concentration is preferably 600 ppm or less, more preferably 400 ppm or less.

In the case of polymerizing and/or hardening the organic compound by the ultraviolet irradiation, a lamp having an intensity of 80 W/cm or more is preferably used for the irradiation. Examples of such lamps include low-pressure mercury lamps, middle-pressure mercury lamps, high-pressure mercury lamps, metal halide lamps, etc. Ozoneless-type lamps, which generate less ozone, may be used for the ultraviolet irradiation.

The flat layer may contain a binder, which may be compatible or incompatible with the monomer. The flat layer may comprise two or more layers. Before forming the flat layer on the body of the pressing member, the pressing member may be surface-treated or coated with an undercoating layer to prevent peeling of the flat layer and to increase the durability of the pressing member.

The organic compound for the flat layer is preferably addition-polymerized or ring-opening-polymerized by ultraviolet rays, electron beams, or heat. Examples of addition-polymerizable compounds include compounds with an ethylenic unsaturated bond. Examples of ring-opening-polymerizable compounds include compounds with an epoxy group.

The flat layer may comprise a radical- or cation-polymerizable compound. Examples of preferred radical-polymerizable compounds include urethane acrylate compounds, acryl compounds, and methacryl compounds. Examples of preferred cation-polymerizable compounds include epoxy-containing glycidyl ether compounds.

(b-1) Hardenable Organic Compound (b-1-1) Compound with Ethylenic Unsaturated Bond Examples of the compounds with an ethylenic unsaturated bond include acrylic acid and salts thereof, acrylic esters, acrylamide compounds, methacrylic acid and salts thereof, methacrylic esters, methacrylamide compounds, maleic anhydride, maleic esters, itaconic esters, styrene compounds, vinyl ethers, vinyl esters, N-vinyl heterocyclic compounds, allyl ethers, allyl esters, derivatives thereof, etc. These compounds have an acryloyl group, a methacryloyl group, an ethacryloyl group, an acrylamide group, an allyl group, a vinyl ether group, a vinyl thioether group, etc. The compounds may be used alone or in combination.

Typical examples of the compounds with an ethylenic unsaturated bond are described below without intention of restricting the material for the flat layer. Examples of polyester acrylates and polyester methacrylates include Aronixes M-5300, M-5400, M-5500, M-5600, M-5700, M-6100, M-6200, M-6300, M-6500, M-7100, M-8030, M-8060, and M-8100 (trade names, Toagosei Chemical Industry Co., Ltd.); Biscoats 700 and 3700 (trade names, Osaka Organic Chemical Industry Ltd.); Kayarads HX-220 and HX-620 (trade names, Nippon Kayaku Co., Ltd.); etc.

Examples of epoxy acrylates and epoxy methacrylates include NK esters EA-800 and EPM-800 (trade names, Shin-Nakamura Chemical Co., Ltd.); Biscoats 600 and 540 (trade names, Osaka Organic Chemical Industry Ltd.); Photomers 3016 and 3082 (trade names, San Nopco Ltd.); etc.

Examples of urethane acrylates and urethane methacrylates include Aronixes M-1100, M-1200, M-1210, M-1250, M-1260, M-1300, and M-1310 (trade names, Toagosei Chemical Industry Co., Ltd.); Biscoats 812, 823, and 832 (trade names, Osaka Organic Chemical Industry Ltd.; NK Esters U-4HA, U-108A, U-122A, U-200AX, U-340AX, U-1084A, U-4HA, U-6HA, U-324A, U-A-100, U-401A, U-1301A, U-601BA, U-1001BA, U-423A, U-412TXA, U-423TXA, and U-0108B (trade names, Shin-Nakamura Chemical Co., Ltd.); etc.

Examples of monofunctional acrylates and monofunctional methacrylates include methyl acrylate, ethyl acrylate, butyl acrylate, methyl methacrylate, butyl methacrylate, 2-ethylhexyl acrylate, ethoxyethyl acrylate, 2-hydroxyethyl acrylate, 2-hydroxyethyl methacrylate, 2-hydroxypropyl acrylate, furfuryl acrylate, tetrahydrofurfuryl acrylate, phenoxyethyl acrylate, cyclohexyl acrylate, cyclohexyl methacrylate, benzyl acrylate, tricyclodecanyloxy acrylate, nonylphenyloxyethyl acrylate, 1,3-dioxolane acrylate, glycidyl methacrylate, N,N-dimethylaminoethyl acrylate, N,N-dimethylaminoethyl methacrylate, N,N-diethylaminoethyl methacrylate, butoxyethyl acrylate, etc. Further examples of the monofunctional acrylates and the monofunctional methacrylates include ethylene oxide-modified phenoxylated phosphoric acrylate; ethylene oxide-modified butoxylated phosphoric acrylate; Aronix M-101, Aronix M-102, Aronix M-111, Aronix M-113, Aronix M-114, Aronix M-117, Aronix M-120, Aronix M-152, and Aronix M-154 (trade names, Toagosei Chemical Industry Co., Ltd.); MK Ester M-20G, MK Ester M-40G, MK Ester M-90G, MK Ester M-230GCB-1, MK Ester SA, MK Ester S, Topolene-M, MK Ester AMP-18G, MK Ester AMP-20G, MK Ester AMP-60G, MK Ester AM-90G, MK Ester A-SA, and MK Ester LA (trade names, Shin-Nakamura Chemical Co., Ltd.); etc.

Examples of polyfunctional acrylates, polyfunctional methacrylates, and polyfunctional oligomers include 1,6-hexanediol diacrylate, 1,6-hexanediol dimethacrylate, neopentyl glycol diacrylate, butanediol dimethacrylate, neopentyl glycol dimethacrylate, trimethylolpropane triacrylate, trimethylolpropane trimethacrylate, diethylene glycol diacrylate, polyethylene glycol diacrylate, polyethylene glycol dimethacrylate, polypropylene glycol diacrylate, butanediol diacrylate, tricyclodecanedimethylol diacrylate, polypropylene glycol dimethacrylate, pentaerythritol diacrylate, dipentaerythritol hexaacrylate, dipentaerythritol hexaacrylate, dipentaerythritol pentaacrylate, isocyanuric acid diacrylate, pentaerythritol triacrylate, pentaerythritol trimethacrylate, pentaerythritol tetramethacrylate, isocyanuric acid triacrylate, pentaerythritol tetraacrylate, ethylene oxide-modified pentaerythritol tetraacrylate, propylene oxide-modified pentaerythritol tetraacrylate, propylene oxide-modified dipentaerythritol polyacrylate, ethylene oxide-modified dipentaerythritol polyacrylate, a dimethacrylate derivative of polyoxyalkylenated bisphenol A, a diacrylate derivative of polyoxyethylenated bisphenol A, 2-(2-hydroxy-1,1-dimethylethyl)-5-hydroxymethyl-5-ethyl-1,3-dioxane diacrylate, 2-(2-hydroxy-1,1-dimethylethyl)-5,5-dihydroxymethyl-1,3-dioxane triacrylate, a triacrylate derivative of a trimethylolpropane-propylene oxide-adduct, a hexaacrylate derivative of a dipentaerythritol-caprolactone-adduct, polyacrylate derivatives of hydroxy polyethers, etc.

Examples of other polyfunctional acrylates, polyfunctional methacrylates, and polyfunctional oligomers include Aronixes M-210, M-215, M-220, M-230, M-233, M-240, M-245, M-305, M-309, M-310, M-315, M-320, M-325, M-330, M-400, TO-458, TO-747, TO-755, THIC, and TA2 (trade names, Toagosei Chemical Industry Co., Ltd.); Kayarads TC-110S, TC-120S, HDDA, NPGDA, TPGDA, PEG400DA, MANDA, HX-220, HX-620, R-551, R-712, R-604, R-167, TPA-320, TPA-330, PET-30, D-310, D-330, DPHA, DPCA-20, DPCA-30, DPCA-60, and DPCA-120 (trade names, Nippon Kayaku Co., Ltd.); NK Esters 1G, 2G, 3G, 4G, 5G, 14G, 23G, BG, HD, NPG, APG-400, APG-700, A-BPE-4, 701A, TMPT, A-TMPT, A-TMM-3, A-TMM-3L, A-TMMT, 9PG, 701, BPE-100, BPE-200, BPE-500, BPE-1300, A-200, A-400, A-600, A-HD, A-NPG, APG-200, A-BPE-10, 701-A, and A-BPP-3 (trade names, Shin-Nakamura Chemical Co., Ltd.); etc.

Further examples of the compounds with an ethylenic unsaturated bond include acrylonitrile, methacrylonitrile, acrylamide, vinyl acetate, vinyl propionate, vinylpyrrolidone, unsaturated esters of polyols, etc. The unsaturated esters of polyols are preferred among them, and examples thereof include ethylene diacrylate, diethylene glycol diacrylate, glycerol triacrylate, trimethylolpropane triacrylate, pentaerythritol tetraacrylate, and acryloylmorpholine, etc. These compounds may have two or more unsaturated bonds.

(b-1-2) Compound with Epoxy Group

The compound with an epoxy group may be a compound having one or a plurality of epoxy rings such as glycidyl acrylate. The compound may be a polymerizable oligomer or a polymerizable polymer.

Specific examples of the compounds with an epoxy group are explained below without intention of restricting the scope of the present invention. Examples of the epoxy-containing glycidyl ethers include Epolights M-1230, 40E, 200E, 400E, 70P, 200P, 400P, 1500NP, 1600, 80MF, 100MF, 4000, 3002, and FR-1500 (trade names, Kyoeisha Chemical Co., Ltd.), etc.

(b-2) Polymerization Initiator

It is preferred that a reaction initiator, a sensitizer, a crosslinking agent, a hardening agent, a polymerization promotor, etc. is added to the monomer solution of the hardenable organic compound for the flat layer if necessary. Examples of photoreaction initiators and photopolymerization initiators used in this invention include benzophenone compounds, acetophenone compounds such as dichloroacetophenone and trichloroacetophenone, benzoin compounds, thioxanthone compounds, Michler's Ketone, benzyl compounds, benzoin alkyl ethers, benzyl dimethyl ketal, tetramethylthiuram monosulfide, azo compounds, etc. The initiators are described in detail in *Ultraviolet Ray Hardening System*, pages 63 to 147 (1989, General Technical Center), etc. Preferable photoreaction initiators are benzophenone compounds and acetophenone compounds. Specific examples of the initiators include Irgacure 184, Irgacure 651, and Irgacure 1174 (trade names, Ciba-Geigy Japan Ltd.), etc.

Cationic polymerization initiators may be used for the ring-opening polymerization. Examples of the cationic polymerization initiators include aromatic onium salts, sulfonium salts of elements of Group VIa of the Periodic Table of Elements, etc. Specific examples of the aromatic onium salts include salts of elements of Group Va of the Periodic Table of Elements including sulfonium salts, such as triphenylphenacylphosphonium hexafluorophosphate; salts of elements of Group VIa of the Periodic Table of Elements including sulfonium salts, such as triphenylsulfonium tetrafluoroborate, triphenylphosphonium hexafluorophosphate, tris(4-thiomethoxyphenyl)sulfonium hexafluorophosphate, and triphenylsulfonium hexafluoroantimonate; and salts of elements of Group VIIa of the Periodic Table of Elements including iodonium salt such as diphenyliodonium chloride. In the case of using the aromatic onium salt as the cationic polymerization initiator, an epoxy compound is preferably used as the monomer. The epoxy compound is described in detail in U.S. Pat. Nos. 4,058,401, 4,069,055, 4,101,513, and 4,161,478.

The sulfonium salts of elements of Group VIa of the Periodic Table of Elements include triarylsulfonium hexafluoroantimonates. The amount of the polymerization initiator is preferably 0.5 to 30 parts by weight, particularly 2 to 20 parts by weight, per 100 parts by weight of the monomers. When the amount is less than 0.5 parts by weight, the ultraviolet-curing rate is remarkably reduced. The reaction initiator is preferably an organic compound.

(b-3) Hardening Agent

The flat layer of the hardenable organic compound may be hardened by a hardening agent. Hardening agents described in JP 61-199997 A and JP 58-215398 A may be used for hardening an organic solvent-soluble polymer. Hardening agents described in U.S. Pat. No. 4,678,739, JP 59-116655 A, JP 62-245261 A and JP 61-18942 A are suitable for hardening water-soluble polymers. Examples of the hardening agents include aldehyde-based hardening agents such as formaldehyde; aziridine-based hardening agents; epoxy-based hardening agents; vinylsulfone-based hardening agents such as N,N'-ethylene-bis(vinylsulfonylacetamido)ethane; N-methylol-based hardening agents such as dimethylolurea; and high-molecular-weight hardening agents described in JP 62-234157 A.

(b-4) Additive

Various additives such as an antioxidant, an antistatic agent, a dispersing agent, a stabilizer, and a lubricant may be added in combination to the flat layer. A drying agent may be added to the monomer solution of the hardenable organic compound, etc. unless the hardening is practically hindered. The drying agent may not be particularly restrictive, but any agent commonly used in the field of semiconductors may be used. Examples of the drying agents include alkaline metal oxides, alkaline earth metal oxides, sulfates, metal halides, perchlorates, organic compounds, organic metal compounds, etc.

Various surfactants may be added to the flat layer as a coating aid, an antistatic agent, or a transporting lubricant, etc. The surfactants include nonionic surfactants, anionic surfactants, ampholytic surfactants, and cationic surfactants. Specific examples of the surfactants are described in JP 62-173463 A, JP 62-183457 A, etc. Organic fluoro compounds may be used in the flat layer. Typical examples of the organic fluoro compounds include fluorine-containing surfactants described in JP 57-9053 B, JP 61-20944 A, and JP 62-135826 A; fluorine-containing oils such as fluorine oils; and hydrophobic fluorine compounds including solid fluororesins such as tetrafluoroethylene resins. Common releasing agents may be used as the surfactants, examples thereof including solid or wax agents such as polyethylene wax, amide wax, silicone resin powders, and fluororesin powders; surfactants such as fluorine-containing surfactants and phosphate-based surfactants; oil agents such as paraffin oils, silicone oils, and fluorine oils; etc. The silicone oils may be unmodified or modified. For example, the silicone oils may be carboxy-modified, amino-modified, epoxy-modified, polyether-modified, or alkyl-modified. The modified silicone oils may be used alone or in combination, and examples thereof include ones described in Technical Data "Modified Silicone Oils", pages 6 to 18B, Silicone Division of Shin-Etsu Chemical Co., Ltd. In the case of using an organic solvent-soluble binder in the flat layer, an amino-modified silicone oil having a group capable of reacting with a crosslinking group of the binder, such as an isocyanate group, is preferred. In the case of using a water-soluble binder, a carboxy-modified silicone oil such as X-22-3710 (trade name) available from the Silicone Division of Shin-Etsu Chemical Co., Ltd., or an epoxy-modified silicone oil such as KF-100T (trade name) available from the Silicone Division of Shin-Etsu Chemical Co., Ltd. is preferably emulsified in the water-soluble binder.

(b-5) Inorganic Oxide and Inorganic Nitride

The inorganic oxide and/or the inorganic nitride for forming the flat layer preferably have insulation properties. Examples of the inorganic oxides having the insulation properties include silicon oxide, germanium oxide, zinc oxide, aluminum oxide, titanium oxide, copper oxide, etc. Examples of the inorganic nitrides having the insulation properties include silicon nitride, germanium nitride, aluminum nitride, etc. The flat layer may be one or a plurality of the compounds.

The flat layer of the inorganic oxide and/or the inorganic nitride preferably has a thickness of 10 nm to 10 μm and more preferably has a thickness of 10 nm to 1000 nm. When the thickness is less than 10 nm, the flat layer is poor in the insulation properties. On the other hand, when the thickness is more than 10 μm, the flat layer is likely to be cracked to form pinholes, thereby exhibiting reduced insulation properties. Unlimited examples of the methods for forming the flat layer of a metal oxide and/or a metal nitride include dry methods such as vapor deposition methods, sputtering methods, and CVD methods; wet methods such as sol-gel methods; and methods of applying a coating liquid prepared by dispersing particles of the metal oxide and/or the metal nitride in a solvent.

(b-6) Binder

The flat layer may contain a binder, which may be compatible or incompatible with the monomer. The binder may be selected from various resins capable of forming a film. The resin for the binder is preferably excellent in adhesion to the electrode and/or the substrate. The amount of the binder is preferably 10 to 600 parts by weight per 100 parts by weight of the monomers. A solvent for dissolving or dispersing the hardenable organic compound monomers and the binder may be any known one.

The resin for the binder may be any resin known in the art. A high-heat-resistant resin is preferably used as the binder, and examples thereof include polyamide resins; polyester resins; epoxy resins; polyurethane resins; polyacryl resins such as polymethyl methacrylate, polyacrylamide, and polystyrene-2-acrylonitrile; vinyl resins such as polyvinylpyrrolidone; polyvinyl chloride resins such as vinyl chloride-vinyl acetate copolymers; polycarbonate resins; polystyrenes; polyphenylene oxides; cellulose-based resins such as methylcellulose, ethylcellulose, carboxymethylcellulose, cellulose acetate hydrogen phthalate, cellulose acetate, cellulose acetate propionate, cellulose acetate butyrate, and cellulose triacetate; polyvinyl alcohol resins such as partially saponified derivatives of polyvinyl alcohol, polyvinyl butyral, etc.; petroleum resins; rosin derivatives; cumarone-indene resins; terpene-based resins; polyolefin resins such as polyethylene and polypropylene; etc. The binder may be a water-soluble and/or water-dispersible polymer, and it is preferred that such a polymer is water-dispersible and can be made water-insoluble by drying.

(3) Formation of Organic Layer on Pressing Member

In a case where the organic layer contains a high-molecular-weight compound as a binder, the organic layer is preferably formed on the pressing member by a wet method. In the wet method, materials for the organic layer are generally dissolved in an organic solvent, and the resultant solution is applied to the pressing member. An application method is not particularly limited, as long as it can form a uniform organic layer with a dry thickness of 200 nm or less. Such application methods may be a spin-coating method, a gravure-coating method, a dip-coating method, a casting method, a die-coating method, a roll-coating method, a bar-coating method, an extrusion-coating method, an ink-jet-coating method, etc. Preferable among them are a roll-to-roll extrusion-coating method.

In a case where the organic layer is composed of low-molecular-weight compounds, a method for forming the organic layer is not particularly limited as long as it can form an layer with a uniform thickness distribution at a dry thickness of 200 nm or less, and the organic layer may be formed by the above application methods or by a vapor deposition method. In this case, the organic layer is preferably formed by a vacuum deposition method.

(4) Organic Layers

The organic layers are disposed between an anode and a cathode in the organic electroluminescent device. The organic layers are classified to a light-emitting organic layer, an electron-transporting organic layer, a hole-transporting organic layer, an electron-injecting layer, a hole-injecting layer, etc. depending on their functions. The organic layers may further include various layers for improving light emission color. Specific examples of compounds used for the organic layers are described in *Organic EL Display* (Technotimes Co., Separate Volume of *Monthly Display*, the October issue of 1998), etc.

The glass transition temperatures of the organic layer or components therein are preferably from 40° C. to the transfer temperature +40° C., more preferably from 50° C. to the transfer temperature +20° C., particularly from 60° C. to the transfer temperature. The flow-starting temperatures of the organic layer or the components therein are preferably from 40° C. to the transfer temperature +40° C., more preferably from 50° C. to the transfer temperature +20° C., particularly from 60° C. to the transfer temperature. The glass transition temperature can be measured by a differential scanning calorimeter (DSC). The flow-starting temperature can be measured by Flow Tester CFT-500 available from Shimadzu Corporation, etc.

(a) Light-emitting Organic Layer

The light-emitting organic layer comprises at least one light-emitting compound. Though not restrictive, the light-emitting compound may be a fluorescent compound or a phosphorescent compound. The fluorescent compound and the phosphorescent compound may be used in combination. In the present invention, the phosphorescent compound is preferably used from the viewpoints of brightness and light-emitting efficiency.

Examples of the fluorescent compounds include benzoxazole derivatives; benzoimidazole derivatives; benzothiazole derivatives; styrylbenzene derivatives; polyphenyl derivatives; diphenylbutadiene derivatives; tetraphenylbutadiene derivatives; naphthalimido derivatives; coumarin derivatives; perylene derivatives; perynone derivatives; oxadiazole derivatives; aldazine derivatives; pyralidine derivatives; cyclopentadiene derivatives; bis(styryl)anthracene derivatives; quinacridon derivatives; pyrrolopyridine derivatives; thiadiazolopyridine derivatives; styrylamine derivatives; aromatic dimethylidine compounds; metal complexes such as 8-quinolinol derivative-metal complexes and rare-earth metal complexes; light-emitting polymer compounds such as polythiophene derivatives, polyphenylene derivatives, polyphenylenevinylene derivatives and polyfluorene derivatives; etc. The fluorescent compounds may be used alone or in combination.

The phosphorescent compound preferably utilizes triplet excitons for light emission. The phosphorescent compound is preferably an ortho-metallation complex or a porphyrin complex. The porphyrin complex is preferably a porphyrin-platinum complex. The phosphorescent compounds may be used alone or in combination.

The ortho-metallation complexes used in the present invention may be such compounds as described in Akio Yamamoto, "*Metalorganic Chemistry, Foundations and Applications,*" pages 150 to 232, Shokabo Publishing Co., Ltd., (1982); H. Yersin, "*Photochemistry and Photophysics of Coordination Compounds,*" pages 71 to 77 and 135 to 146, Springer-Verlag, Inc. (1987), etc. Although ligands of the ortho-metallation complexes are not particularly limited, the ortho-metallation complexes generally have particular ligands. Preferred examples of the particular ligands include 2-phenylpyridine derivatives, 7,8-benzoquinoline derivatives, 2-(2-thienyl)pyridine derivatives, 2-(1-naphthyl)pyridine derivatives and 2-phenylquinoline derivatives. The derivatives may have a substituent. The ortho-metallation complexes may have other ligands than the particular ligands. Center metal atoms of the ortho-metallation complexes may be selected from transition metals. The center metals are preferably rhodium, platinum, gold, iridium, ruthenium or palladium. The organic compound layers comprising such ortho-metallation complexes are excellent in brightness and light-emitting efficiency. Specific examples of such ortho-metallation complexes are described in Japanese Patent Application No. 2000-254171.

The ortho-metallation complexes used in the present invention may be synthesized by known methods disclosed in *Inorg. Chem.*, 30, 1685, 1991; *Inorg. Chem.*, 27, 3464, 1988; *Inorg. Chem.*, 33, 545, 1994; *Inorg. Chim. Acta*, 181, 245, 1991; *J. Organomet. Chem.*, 335, 293, 1987; *J. Am. Chem. Soc.*, 107, 1431, 1985; etc.

Though not restrictive, the amount of the light-emitting compound in the light-emitting organic layer is, for instance, preferably 0.1 to 70% by mass, more preferably 1 to 20% by mass. When the amount of the light-emitting compound is less than 0.1% by mass or more than 70% by mass, the addition of the light-emitting compound does not provide sufficient effects.

The light-emitting organic layer may contain host compounds, hole-transporting materials, electron-transporting materials, electrically inactive polymer binders, etc., if necessary. Incidentally, the functions of these materials may be achieved even with one compound. For instance, carbazole derivatives can act not only as host compounds but also as hole-transporting materials.

The host compounds causes energy transfer from their excited state to the light-emitting compounds to accelerate the light emission of the light-emitting compounds. Specific examples of the host compounds include carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidene compounds, porphyrin compounds, anthraquinodimethane derivatives, anthrone derivatives, diphenylquinone derivatives, thiopyran dioxide derivatives, carbodimide derivatives, fluorenylidenemethane derivatives, distyrylpyrazine derivatives, anhydrides of heterocyclic tetracarboxylic acids having a structure such as naphthalene and perylene, phthalocyanine derivatives, 8-quinolinol derivative-metal complexes, metallophthalocyanines, metal complexes containing benzoxazole or benzothiazole ligands, polysilane compounds, poly(N-vinylcarbazole) derivatives, aniline copolymers, electrically conductive polymers and oligomers such as oligothiophenes and polythiophenes, polythiophene derivatives, polyphenylene derivatives, polyphenylenevinylene derivatives, polyfluorene derivatives, etc. The host compounds may be used alone or in combination. The amount of the host compound in the light-emitting organic layer is preferably 0 to 99.9% by mass, more preferably 0 to 99.0% by mass.

Though not restrictive, the hole-transporting materials may be low- or high-molecular-weight materials if they have any of functions of injecting holes from the anode into the light-emitting organic layer, transporting holes, and blocking electrons from the cathode. Examples of the hole-transporting materials include carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidyne compounds, porphyrin compounds, polysilane compounds, poly(N-vinylcarbazole) derivatives, aniline copolymers, electrically conductive polymers and oligomers such as oligothiophenes and polythiophenes, polythiophene derivatives, polyphenylene derivatives, polyphenylenevinylene derivatives, polyfluorene derivatives, etc. These hole-transporting materials may be used alone or in combination. The amount of the hole-transporting material in the light-emitting organic layer is preferably 0 to 99.9% by mass, more preferably 0 to 80.0% by mass.

The electron-transporting materials are not particularly limited as long as they have any of functions of injecting electrons from the cathode into the light-emitting organic layer, transporting electrons, and blocking holes from the anode. Examples of the electron-transporting materials include triazole derivatives, oxazole derivatives, oxadiazole derivatives, fluorenone derivatives, anthraquinodimethane derivatives, anthrone derivatives, diphenylquinone derivatives, thiopyran dioxide derivatives, carbodimide derivatives, fluorenylidenemethane derivatives, distyrylpyrazine derivatives, anhydrides of heterocyclic tetracarboxylic acids having structures such as naphthalene and perylene, phthalocyanine derivatives, 8-quinolinol metal complexes and derivatives thereof, metallophthalocyanines, metal complexes containing benzoxazole or benzothiazole ligands, aniline copolymers, electrically conductive polymers and oligomers such as oligothiophenes and polythiophenes, polythiophene derivatives, polyphenylene derivatives, polyphenylenevinylene derivatives, polyfluorene derivatives, etc. These electron-transporting materials may be used alone or in combination. The amount of the electron-transporting material in the light-emitting organic layer is preferably 0 to 99.9% by mass, more preferably 0 to 80.0% by mass.

Examples of the polymer binders include polyvinyl chlorides, polycarbonates, polystyrenes, polymethyl methacrylates, polybutyl methacrylates, polyesters, polysulfones, polyphenylene oxides, polybutadienes, hydrocarbon resins, ketone resins, phenoxy resins, polyamides, ethyl celluloses, polyvinyl acetates, ABS resins, polyurethanes, melamine resins, unsaturated polyesters, alkyd resins, epoxy resins, silicone resins, polyvinyl butyrals, polyvinyl acetals, etc. The polymer binders may be used alone or in combination. In the case of using the polymer binder, a large-area light-emitting organic layer can be easily formed by a wet method.

The thickness of the light-emitting organic layer is preferably 10 to 200 nm, more preferably 20 to 80 nm. When the thickness exceeds 200 nm, driving voltage is likely to rise. On the other hand, when the thickness of the light-emitting organic layer is less than 10 nm, short-circuiting is likely to occur in the organic electroluminescent device.

(b) Hole-transporting Organic Layer

The organic electroluminescent device may comprise a hole-transporting organic layer comprising the above hole-transporting material, if necessary. The hole-transporting organic layer may contain the above polymer binder. The thickness of the hole-transporting organic layer is preferably 10 to 200 nm, more preferably 20 to 80 nm. When the thickness of the hole-transporting organic layer exceeds 200 nm, driving voltage is likely to rise. On the other hand, when it is less than 10 nm, short-circuiting is likely to occur in the organic electroluminescent device.

(c) Electron-transporting Organic Layer

The organic electroluminescent device may have an electron-transporting organic layer comprising the above electron-transporting material, if necessary. The electron-transporting organic layer may contain the above polymer binder. The thickness of the electron-transporting organic layer is preferably 10 nm to 200 nm, more preferably 20 to 80 nm. When the thickness exceeds 200 nm, driving voltage is likely to rise. On the other hand, when it is less than 10 nm, short-circuiting is likely to occur in the organic electroluminescent device.

In a case where the organic layer is formed by a wet film-forming method, a solvent may be used for dissolving materials for the organic layer to prepare a coating liquid. The solvents are not particularly restrictive, but may be properly selected depending on the types of the hole-transporting materials, the ortho-metallated complexes, the host materials, the polymer binders, etc. Examples of the solvents include halogen solvents such as chloroform, tetrachloromethane, dichloromethane, 1,2-dichloroethane and chlorobenzene; ketone solvents such as acetone, methyl ethyl ketone, diethyl ketone, n-propyl methyl ketone and cyclohexanone; aromatic solvents such as benzene, toluene and xylene; ester solvents such as ethyl acetate, n-propyl acetate, n-butyl acetate, methyl propionate, ethyl propionate, γ-butyrolactone and diethyl carbonate; ether solvents such as tetrahydrofuran and dioxane; amide solvents such as dimethylformamide and dimethylacetamide; dimethylsulfoxide; water; etc.

The solid content of the coating liquid is not particularly limited, and the viscosity of the coating liquid may be selected depending on the wet film-forming method.

In the case of forming a plurality of organic layers, the transfer method of the present invention may be used with other methods. Examples of the other methods include dry methods such as a vapor deposition method and a sputtering method; wet methods such as a dipping method, a spin-coating method, a dip-coating method, a casting method, a die-coating method, a roll-coating method, a bar-coating method and a gravure-coating method; a printing method; etc.

[3] Organic Electroluminescent Device (1) Structure

The structure of the organic electroluminescent device may be any one of the following laminate structures formed on the substrate in the described orders or in opposite orders:

(a) Transparent conductive layer/light-emitting organic layer/rear-surface electrode;
(b) Transparent conductive layer/light-emitting organic layer/electron-transporting organic layer/rear-surface electrode;
(c) Transparent conductive layer/hole-transporting organic layer/light-emitting organic layer/electron-transporting organic layer/rear-surface electrode;
(d) Transparent conductive layer/hole-transporting organic layer/light-emitting organic layer/rear-surface electrode;
(e) Transparent conductive layer/light-emitting organic layer/electron-transporting organic layer/electron-injecting layer/rear-surface electrode;
(f) Transparent conductive layer/hole-injecting layer/hole-transporting organic layer/light-emitting organic layer/electron-transporting organic layer/electron-injecting layer/rear-surface electrode, etc.

The light-emitting organic layer comprises a fluorescent compound and/or a phosphorescent compound, and the emitted light is generally taken out from the transparent conductive layer. Specific examples of compounds used in each organic layer are described, for instance, in *Organic EL Display* (Technotimes Co., Separate Volume of *"Monthly Display,"* the October issue of 1998), etc.

(2) Substrate

Materials for the substrate are not particularly limited as long as they are excellent in heat resistance, dimensional stability, solvent resistance, insulation property and workability, and poor in gas permeability and hygroscopicity. Specific examples of preferred substrates include sheets of inorganic materials such as yttrium-stabilized zirconia (YSZ) and glass; metallic foils such as aluminum foils, copper foils, stainless steel foils, gold foils, and silver foils; sheets of plastics such as polyimides, liquid crystal polymers, fluororesins (e.g. tetrafluoroethylene resins (PTFE) and trifluorochloroethylene resins (PCTFE)), polyethylene naphthalates (PEN), polycarbonates, polyether sulfones (PES), and rigid polyvinyl chlorides; laminates thereof; etc.

The shape, structure, size, etc. of the substrate may be appropriately determined in accordance with purposes and applications of the organic electroluminescent device. In general, the substrate has a plate shape. The substrate may have a single-layer structure or a multi-layer structure, and may comprise one or a plurality of members. The substrate may be transparent or opaque. For example when the transparent electrode to be hereinafter described is disposed between the substrate and the organic layers including the light-emitting organic layer, the emitted light may be taken out from the substrate side. In this case, it is preferred that the substrate is colorless transparent to reduce the scattering and attenuation of light. The substrate may be colored depending on preferences.

A metallic foil having an insulating layer formed on one or both sides thereof is preferably used as the substrate to prevent the short-circuiting of the organic electroluminescent device. The metallic foil is not particularly limited, and may be an aluminum foil, a copper foil, a stainless steel foil, a gold foil, a silver foil, etc. The aluminum foil and the copper foil are preferred from the viewpoints of workability and cost. The insulating layer is not particularly limited, and materials therefor include inorganic compounds such as inorganic oxides and inorganic nitrides; polyesters such as polyethylene terephthalates, polybutylene phthalates, and polyethylene naphthalates; plastics such as polystyrenes, polycarbonates, polyether sulfones, polyarylates, allyl diglycol carbonates, polyimides, polycycloolefins, norbornene resins, polychlorotrifluoroethylenes, and polyimides; etc.

The substrate preferably has a linear thermal expansion coefficient of 20 ppm/° C. or less. The linear thermal expansion coefficient may be measured by a method of detecting the change of the length of a sample while heating the sample at a constant rate, such as a TMA method. When the linear thermal expansion coefficient of the substrate is more than 20 ppm/° C., the electrode or the organic layer is likely to be peeled off by heating in the transferring step or in use, resulting in poor durability.

Also the insulating layer formed on the substrate preferably has a linear thermal expansion coefficient of 20 ppm/° C. or less. One or more materials selected from metal oxides such as silicon oxide, germanium oxide, zinc oxide, aluminum oxide, titanium oxide, and copper oxide, and metal nitrides such as silicon nitride, germanium nitride, and aluminum nitride are preferably used for forming the insulating layer having a linear thermal expansion coefficient of 20 ppm/° C. or less. The insulating layer of a metal oxide and/or a metal nitride preferably has a thickness of 10 to 1000 nm. When the thickness is less than 10 nm, the insulating layer is poor in insulation properties. On the other hand, when the thickness is more than 1000 nm, the insulating layer is likely to be cracked to form pinholes, thereby exhibiting reduced insulation properties. Unlimited examples of the methods for forming the insulating layer of a metal oxide and/or a metal nitride include dry methods such as vapor deposition methods, sputtering methods, and CVD methods; wet methods such as sol-gel methods; and methods of applying a liquid prepared by dispersing particles of a metal oxide and/or a metal nitride in a solvent.

Preferable plastic materials having linear thermal expansion coefficients of 20 ppm or less are polyimides and liquid crystal polymers. The properties of the plastic materials are described in detail in *Plastic Databook*, edited by *"Plastic"* Editorial Department, Asahi Kasei AMIDAS, etc. When the plastic materials are used for the insulating layer, a sheet of the plastic material is preferably laminated with an aluminum foil. The sheet of the plastic material preferably has a thickness of 10 to 200 μm. When the thickness of the sheet of the plastic material is less than 10 μm, it is difficult to handle the sheet in the laminating step. On the other hand, when the thickness of the sheet is more than 200 μm, the sheet is poor in flexibility, resulting in inconvenience in handling.

The insulating layer may be formed on one or both sides of the metallic foil. In the case of forming the insulating layers on the both sides, the insulating layers may be independently composed of a metal oxide and/or a metal nitride, or a plastic such as polyimide. Further, a hard coating layer and an undercoating layer may be formed, if necessary.

A moisture permeation-inhibiting layer (a gas barrier layer) may be formed on the electrode side and/or the other side of the substrate. The moisture permeation-inhibiting layer preferably comprises an inorganic compound such as silicon nitride and silicon oxide. The moisture permeation-inhibiting layer may be formed by a radio frequency sputtering method, etc. Further, a hard coating layer and an undercoating layer may be formed on the substrate, if necessary.

It is preferred that the insulating layer is formed on one or both sides of the substrate of the metallic foil. The metallic foil is not particularly limited, and may be an aluminum foil, a copper foil, a stainless steel foil, a gold foil, a silver foil, etc. The aluminum foil and the copper foil are preferred from the viewpoints of workability and cost. The insulating layer is not particularly limited, and materials therefor include inorganic compounds such as inorganic oxides and inorganic nitrides; polyesters such as polyethylene terephthalates, polybutylene phthalates, and polyethylene naphthalates; plastics such as polystyrenes, polycarbonates, polyether sulfones, polyarylates, allyl diglycol carbonates, polyimides, polycyclolefins, norbornene resins, polychlorotrifluoroethylenes, and polyimides; etc.

The water permeability of the substrate is preferably 0.1 g/m$^2$·day or less, more preferably 0.05 g/m$^2$·day or less, particularly 0.01 g/m$^2$·day or less. The oxygen permeability of the substrate is preferably 0.1 ml/m$^2$·day·atm or less, more preferably 0.05 ml/m$^2$·day·atm or less, particularly 0.01 ml/m$^2$·day·atm or less. The water permeability can be measured according to JIS K7129B, mainly by an MOCON method, and the oxygen permeability can be measured according to JIS K7126B, mainly by an MOCON method. The substrate with the preferred permeabilities can prevent penetration of water and oxygen, which deteriorate the durability of the organic electroluminescent device.

The substrate preferably has a flat, smooth surface. The substrate preferably has a maximum surface roughness Rmax of at most 0.5 times the thickness of the organic layer according to JIS B 0601-1982. The maximum surface roughness Rmax of the substrate is more preferably at most 0.25 times, particularly preferably 0.01 to 0.1 times the thickness. When the maximum surface roughness Rmax is more than 0.5 times the thickness of the organic layer, the transferred organic layer is poor in layer properties such as adhesion to the substrate, and the resultant organic electroluminescent device suffers from unevenness in properties such as light-emitting properties due to short-circuiting, detachment, etc. A flat layer may be formed on the electrode side of the substrate.

The shape, structure, size, etc. of the substrate are not particularly limited, and may be appropriately determined in accordance with purposes and applications of the organic electroluminescent device. In general, the substrate is in a shape of plate or sheet. The substrate is preferably flexible.

(3) Electrode

Any one of the transparent conductive layer and the rear-surface electrode may be used as the cathode, the other being used as the anode, depending on the composition of the organic electroluminescent device.

The anode acts to supply holes to the organic layer. The shape, structure and size of the anode are not restrictive but may be properly selected in accordance with the applications and purposes of the organic electroluminescent device.

The anode may comprise a metal, an alloy, a metal oxide, an electrically conductive compound, a mixture thereof, etc. The anode is preferably made of a material having a work function of 4.0 eV or more. Examples of the materials for the anode include antimony-doped tin oxide (ATO); fluorine-doped tin oxide (FTO); semiconductive metal oxides such as tin oxide, zinc oxide, indium oxide, indium tin oxide (ITO) and indium zinc oxide (IZO); metals such as gold, silver, chromium and nickel; mixtures and laminates of the metals and conductive metal oxides; inorganic, conductive compounds such as copper iodide and copper sulfide; dispersions of the semiconductive metal oxides and the metal compounds; organic, conductive compounds such as polyanilines, polythiophenes and polypyrroles; laminates of the organic, conductive compounds and ITO; etc.

The method for forming the anode on the substrate may be appropriately selected from wet methods such as printing methods and coating methods; physical methods such as vacuum deposition methods, sputtering methods and ion-plating methods; chemical methods such as CVD methods and plasma CVD methods; etc., depending on the above materials. For example, an ITO anode may be formed by a DC or RF sputtering method, a vacuum deposition method, an ion-plating method, etc. An anode of an organic, conductive compound may be formed by a wet method.

The patterning of the anode may be conducted by a chemical etching method such as a photolithography method; a physical etching method using laser, etc.; a vacuum deposition method or a sputtering method using a mask; a lift-off method; a printing method; etc.

The thickness of the anode may be may be appropriately determined depending on the material. The thickness of the anode is generally 10 nm to 50 µm, preferably 50 nm to 20 µm.

The resistance of the anode is preferably 10$^6$ Ω/square or less, more preferably 10$^5$ Ω/square or less. When the resistance of the anode is 10$^5$ Ω/square or less, a large-area, light-emitting device with excellent performances can be obtained by forming a bus line electrode.

The anode may be colorless transparent, colored transparent, or opaque. In the case of using a transparent anode, the light transmittance of the anode is preferably 60% or more, more preferably 70% or more, to allow light emission from the anode side. The light transmittance can be measured by using a spectrophotometer. Electrodes described in detail in *Developments of Transparent Conductive Films*, supervised by Yutaka Sawada, CMC Publishing Co., Ltd., 1999, etc. may be used as the transparent anode in the present invention. Particularly in the case of using a low-heat-resistance plastic substrate, it is preferable that the transparent anode of ITO or IZO is formed at a low temperature of 150° C. or lower.

(4) Cathode

The cathode acts to inject electrons into the organic layer. The shape, structure and size of the cathode is not restrictive, and may be properly selected in accordance with the applications and purposes of the organic electroluminescent device.

The cathode may comprise a metal, an alloy, a metal oxide, an electrically conductive compound, a mixture thereof, etc. The cathode is preferably composed of a material having a work function of 4.5 eV or less. Examples of the materials for the cathode include alkali metals such as Li, Na, K and Cs; alkaline earth metals such as Mg and Ca; gold; silver; lead; aluminum; sodium-potassium alloys; lithium-aluminum alloys; magnesium-silver alloys; indium; rare earth metals such as ytterbium; etc. Although the materials may be used alone, a plurality of materials may be used for the cathode to improve both of stability and electron injection properties.

Among the above materials, alkali metals and alkaline earth metals are preferred from the viewpoint of the electron injection properties, and aluminum-based materials are preferred from the viewpoint of storage stability. Usable as the aluminum-based materials are aluminum itself and aluminum-based alloys and mixtures containing 0.01 to 10% by weight of an alkali metal or an alkaline earth metal, such as lithium-aluminum alloys, and magnesium-aluminum alloys.

In the case of allowing light emission from the cathode side, the cathode may be substantially transparent electrode with a required light transmittance. The cathode may have a two-layer structure comprising a thin metal film and a transparent conductive layer, to achieve both of electron injection and light transmittance. Materials for the thin metal film are described in detail in JP 2-15595 A and JP 5-121172 A. The thickness of the thin metal film is preferably 1 to 50 nm. It is difficult to form a uniform thin metal film having a thickness of less than 1 nm. When the thickness of the thin metal film is more than 50 nm, the light transmittance is insufficient.

The transparent conductive layer in the two-layer structure may be composed of any conductive or semiconductive, transparent material. The above-described materials for the anode are preferably used for the transparent conductive layer. In particular, the transparent conductive layer may comprise antimony-doped tin oxide (ATO), fluorine-doped tin oxide (FTO), tin oxide, zinc oxide, indium oxide, indium tin oxide (ITO), indium zinc oxide (IZO), etc.

The thickness of the transparent conductive layer is preferably 30 to 500 nm. When the thickness of the transparent conductive layer is less than 30 nm, the transparent conductive layer is poor in the conductivity or the semiconductivity. The transparent conductive layer having a thickness of more than 500 nm is unsuitable for production.

The method for forming the cathode is not particularly limited, and may be a known method. The cathode is preferably formed in a vacuum apparatus. The method for forming the cathode on the substrate may be appropriately selected depending on the material from physical methods such as vacuum deposition methods, sputtering methods and ion-plating methods, and chemical methods such as CVD methods and plasma CVD methods. For example, in the case of using a plurality of metals for the cathode, the metals may be sputtered simultaneously or successively. A wet method may be used to form a cathode of an organic conductive material.

The patterning of the cathode may be conducted by a chemical etching method such as a photolithography method; a physical etching method using laser, etc.; a vacuum deposition method or a sputtering method using a mask; a lift-off method; a printing method; etc.

A dielectric layer of a fluorinated alkali or alkaline earth metal having a thickness of 0.1 to 5 nm may be formed between the cathode and the organic layer. The dielectric layer may be formed by a vacuum deposition method, a sputtering method, an ion-plating method, etc.

(5) Other Layers

The organic electroluminescent device preferably comprises a protective layer or a sealing layer to prevent the deterioration of light emission. Further, in the transfer material, a parting layer may be formed between the organic layer and the pressing member, and an adhesive layer may be formed on the organic layer, to improve transferability, unless the light-emitting performance is affected.

(a) Protective Layer

The organic electroluminescent device may comprise a protective layer disclosed in JP 7-85974 A, JP 7-192866 A, JP 8-22891 A, JP 10-275682 A, and JP 10-106746 A, etc. The protective layer is generally formed on the uppermost surface of the organic electroluminescent device. For example, in the case of laminating the substrate, the transparent conductive layer, the organic layer and the rear-surface electrode in this order, the uppermost surface is the outer surface of the rear-surface electrode. Further, for instance, in the case of laminating the substrate, the rear-surface electrode, the organic layer and the transparent conductive layer in this order, the uppermost surface is the outer surface of the transparent conductive layer. The shape, size and thickness of the protective layer are not particularly limited. The protective layer may be made of any material that can prevent substances such as water and oxygen degrading the function of the organic electroluminescent device from entering or penetrating into the device. Preferred materials for the protective layer include silicon monoxide, silicon dioxide, germanium monoxide, germanium dioxide, etc.

Though not restrictive, the protective layer may be formed by a vacuum deposition method, a sputtering method, an activated sputtering method, a molecular beam epitaxy method, a cluster ion beam method, an ion-plating method, a plasma polymerization method, a plasma CVD method, a laser CVD method, a thermal CVD method, a coating method, etc.

(b) Sealing Layer

The sealing layer for preventing penetration of water and oxygen is preferably formed in the organic electroluminescent device. Examples of materials for the sealing layer include copolymers of tetrafluoroethylene and at least one comonomer, fluorine-containing copolymers having cyclic structures in their main chains, polyethylenes, polypropylenes, polymethyl methacrylates, polyimides, polyureas, polytetrafluoroethylenes, polychlorotrifluoroethylenes, polydichlorodifluoroethylenes, copolymers of chlorotrifluoroethylene or dichlorodifluoroethylene and other comonomers, moisture-absorbing substances having water absorption of 1% or more, moisture-resistant substances having a water absorption of 0.1% or less, metals such as In, Sn, Pb, Au, Cu, Ag, Al, Ti and Ni, metal oxides such as MgO, SiO, $SiO_2$, $Al_2O_3$, GeO, NiO, CaO, BaO, $Fe_2O_3$, $Y_2O_3$, and $TiO_2$, metal fluorides such as $MgF_2$, LiF, $AlF_3$, and $CaF_2$, liquid fluorinated carbons such as perfluoroalkanes, perfluoroamines and perfluoroethers, liquids prepared by dispersing substances for adsorbing moisture or oxygen in liquid fluorinated carbons, etc.

The organic layers are preferably sealed by sealing means such as sealing plates and sealing containers to shield the device from moisture, oxygen, etc. The sealing means may be disposed only on the rear-surface electrode. Alternatively, the entire light-emitting structure of the organic electroluminescent device may be covered with the sealing means. The shape, size and thickness of the sealing means are not particularly limited as long as the sealing means can seal and shield the organic layer from outside air. The sealing means may comprise glass, stainless steel, a metal such as aluminum, a plastic such as a polychlorotrifluoroethylene, a polyester and a polycarbonate, a ceramic, etc.

A sealing agent (or an adhesive) may be used to dispose the sealing means on the light-emitting structure. In the case of covering the entire light-emitting structure with the sealing means, the sealing means may be heat-welded without using the sealing agent. Usable as the sealing agent are ultraviolet-curing resins, thermosetting resins, two-part-type hardening resins, etc.

Further, a water-absorbing agent or an inert liquid may be charged between the organic electroluminescent device and the sealing container. Though not restrictive, the water-absorbing agent may be barium oxide, sodium oxide, potassium oxide, calcium oxide, sodium sulfate, calcium sulfate, magnesium sulfate, phosphorus pentoxide, calcium chloride, magnesium chloride, copper chloride, cesium fluoride, niobium fluoride, calcium bromide, vanadium bromide, molecular sieves, zeolite, magnesium oxide, etc. The inert liquids include paraffins, liquid paraffins, fluorine-containing solvents such as perfluoroalkanes, perfluoroamines and perfluorethers, chlorine-containing solvents, silicone oils, etc.

A light can be emitted from the organic electroluminescent device of the present invention by applying DC voltage of usually 2 to 40 V, which may contain an AC component, or DC current between the anode and the cathode.

The organic electroluminescent device of the present invention may be driven by a method described in JP 2-148687 A, JP 6-301355 A, JP 5-29080 A, JP 7-134558 A, JP 8-234685 A, JP 8-241047 A, U.S. Pat. Nos. 5,828,429 and 6,023,308, and Japanese Patent 2784615.

The present invention will be described in more detail below with reference to Examples without intention of restricting the scope of the present invention.

EXAMPLE 1

(A) Preparation of Pressing Member

Two 5-mm-thick white glass plates were prepared, and patterned projections were formed on one surface of each plate to prepare pressing members 201A and 201B having structure shown in FIGS. 7(a) and 7(b). The pressing member A for a finer pattern had projections of 5 μm (height)×100 μm×100 μm, and distance between the projections was 25 μm. The pressing member B had projections of 5 μm (height)×200 μm×100 μm, and distance between the projections was 50 μm. Further, pressing members 202A and 202B were prepared in the same manner as the pressing members 201A and 201B except for using 4-mm-thick quartz glass plates.

Two 30-μm-thick aluminum foils were prepared, and patterned projections were formed on one surface of each foil in the same manner as the pressing members 201A and 201B. 50-μm-thick polyimide sheets (UPILEX 50s available from Ube Industries, Ltd.) were laminated to the both surfaces of each aluminum foil using an adhesive, to form bodies of pressing members. 10% by weight of Irgacure 651 available from Chiba Specialty Chemicals Corporation was added to Aronix M-450 available from Toagosei Co., Ltd. to prepare an ultraviolet-curing resin liquid. The ultraviolet-curing resin liquid was applied to the projection side of each body by a bar coater into a dry thickness of 3 μm, and irradiated with 100-W, high-pressure mercury lamp from height of 5 cm for 5 minutes, to prepare pressing members 203A and 203B.

Pressing members 204A and 204B were prepared in the same manner as the pressing members 203A and 203B except that a thermosetting resin liquid EPX-49-10 available from Asahi Denka Co., Ltd. was applied to the projection side of each body by a bar coater into a dry thickness of 1 μm and heated at 120° C. for 30 minutes. Further, pressing members 205A and 205B having structure shown in FIGS. 8(a) and 8(b) were prepared in the same manner as the pressing members 203A and 203B except that a 50-nm-thick silicon nitride film was formed by a sputtering method.

Pressing members 206A and 206B were prepared in the same manner as the pressing members 203A and 203B except that 50-μm-thick PET sheets Lumirror T-60 available from Toray Industries, Inc. were laminated to the both surfaces of each aluminum foil. Further, pressing members 207A and 207B were prepared in the same manner as the pressing members 206A and 206B except that a thermosetting resin liquid EPX-49-10 available from Asahi Denka Co., Ltd. was applied to the PET sheets by a bar coater into a dry thickness of 1 μm.

Pressing members 208A and 208B were prepared in the same manner as the pressing members 203A and 203B except for changing the maximum surface roughness Rmax according to JIS B 0601-1982 of the top surfaces of the projections. Further, pressing members 209A and 209B were prepared by forming patterned projections on a 50-μm-thick PET sheet Lumirror T-60 available from Toray Industries, Inc. in the same manner as the pressing members 201A and 201B except for changing the maximum surface roughness Rmax of the top surfaces of the projections.

The linear thermal expansion coefficient of each pressing member, and the maximum surface roughness Rmax according to JIS B 0601-1982 of the top surfaces of the projections in each pressing member were measured. The linear thermal expansion coefficient was measured by a TMA method at 20° C. The results are shown in Table 1.

TABLE 1

| Pressing member No. | Body | Flat layer | Linear thermal expansion coefficient (ppm/° C.) | Rmax (nm) | Note |
|---|---|---|---|---|---|
| 201 | White glass | None | 4 | 0.5 | Example |
| 202 | Quartz glass | None | 0.8 | 0.5 | Example |
| 203 | PI/Al/PI[1] | Ultraviolet-curing resin | 10 | 2 | Example |
| 204 | PI/Al/PI[1] | Thermo-setting resin | 10 | 3 | Example |
| 205 | PI/Al/PI[1] | Silicon nitride | 3 | 7 | Example |
| 206 | PET/Al/PET[2] | Ultraviolet-curing resin | 54 | 3 | Example |
| 207 | PET[3] | Ultraviolet-curing resin | 64 | 3 | Example |
| 208 | PI/Al/PI[1] | None | 10 | 250 | Comparative Example |
| 209 | PET[3] | None | 65 | 40 | Comparative Example |

Note
[1]Laminate of an aluminum foil and polyimide sheets disposed on both surfaces of the foil.
[2]Laminate of an aluminum foil and polyethylene terephthalate sheets disposed on both surfaces of the foil.
[3]Polyethylene terephthalate sheet.

(B) Production of Transfer Materials 1001 to 1014

One surface of each pressing member prepared in (A) was spin-coated with a coating liquid for a light-emitting organic layer having a composition containing 40 parts by mass of polyvinyl carbazole (Mw 63,000, available from Aldrich Chemical Co.), 25 parts by mass of polyvinyl butyral (Mw 140,000, S-Lec BX-5 available from Sekisui Chemical Co., Ltd.), 1 part by mass of tris(2-phenylpyridine) iridium complex (an ortho-metallation complex), and 4,500 parts by mass of dichloroethane. The coating liquid applied to each pressing member was dried at the room temperature to form a light-emitting organic layer, thereby producing transfer materials 1001 to 1014 respectively. The light-emitting organic layer thicknesses and the pressing members of the transfer materials 1001 to 1014 are shown in Table 2.

(C) Production of Laminate A (Substrate/Cathode/Electron-transporting Organic Layer)

50-μm-thick polyimide sheets (UPILEX 50s available from Ube Industries, Ltd.) were laminated to both surfaces of a 30-μm-thick aluminum foil using an adhesive. A mask having an opening of 5 mm×5 mm was placed on the laminate, and a 250-nm-thick Al layer was formed as a cathode on the laminate by a vapor deposition method. An organic electron-transporting material represented by the following formula and LiF were vapor-deposited onto the cathode to form a 36-nm-thick, electron-transporting organic layer. Their vapor deposition rates were controlled such that the ratio of LiF to the organic electron-transporting material in the resultant layer was 10% by weight. The Al cathode was connected to an aluminum lead wire.

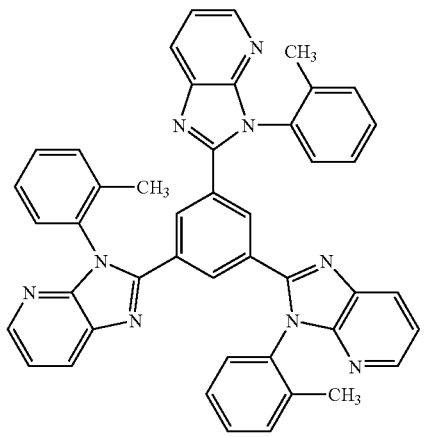

(D) Production of Laminate B (Substrate/Cathode/Electron-transporting Organic Layer/Light-emitting Organic Layer)

The transfer material 1001 was superposed on the laminate A produced in (C) such that the electron-transporting organic layer of the laminate A faced the light-emitting organic layer. They were passed at a speed of 0.1 m/minute between a couple of heating rollers under a nip pressure of 0.3 MPa and a temperature of 160° C. The pressing member was then peeled from the transfer material, so that the light-emitting organic layer was transferred onto the electron-transporting organic layer on the cathode to obtain a laminate 101B. Further, laminates 102B to 114B were produced in the same manner as the laminate 101B except for transferring the light-emitting organic layers of the transfer materials 1002 to 1014, respectively.

(E) Production of Laminate C (Second Substrate/Anode/Hole-transporting Organic Layer)

A white glass plate, which had a size of 0.5 mm (thickness)×2.5 cm×2.5 cm, a linear thermal expansion coefficient of 4 ppm/° C. (measured by a TMA method at 20° C.), and a maximum surface roughness Rmax of 0.5 nm (according to JIS B 0601-1982), was placed in a vacuum chamber, and a 0.2-μm-thick, transparent ITO thin-film electrode was formed on the white glass plate by DC magnetron sputtering using an ITO target containing 10% by mass of $SnO_2$ (an indium/tin molar ratio 95/5) under the conditions of a white glass plate temperature of 250° C. and an oxygen pressure of $1\times10^{-3}$ Pa. The transparent ITO thin-film electrode of the resultant laminate had a surface resistance of 10Ω/square. Then, the transparent ITO electrode was connected to an aluminum lead wire. The white glass plate provided with the transparent ITO electrode was placed in a washing vessel, washed with isopropyl alcohol (IPA), and then subjected to an oxygen plasma treatment. The treated surface of the transparent ITO electrode was spin-coated with an aqueous dispersion of polyethylenedioxythiophene and polystyrene sulfonate (Baytron P available from BAYER AG, solid content 1.3% by mass), and vacuum-dried at 150° C. for 2 hours to form a hole-transporting organic layer having a thickness of 100 nm, so that a laminate C (second substrate/anode/hole-transporting organic layer) was produced.

(F) Production of Organic Electroluminescent Device

The laminate C (second substrate/anode/hole-transporting organic layer) was superposed on the laminate 101B (substrate/cathode/electron-transporting organic layer/light-emitting organic layer) such that the hole-transporting organic layer faced the light-emitting organic layer, and passed at a speed of 0.1 m/minute between a couple of heating rollers at a nip pressure of 0.3 MPa and a temperature of 160° C., to produce an organic electroluminescent device 1. Further, organic electroluminescent devices 2 to 14 were produced in the same manner as the organic electroluminescent device 1 except for using the laminates 102B to 114B, respectively. DC voltage was applied to each organic electroluminescent device by Source-Measure Unit 2400 available from Keithley Instruments, Inc., and the light emission of the device was observed. As a result, the organic electroluminescent devices showed sufficient light emission and excellent adhesion.

(G) Evaluation

The film property and the transfer ratio of each organic electroluminescent device were evaluated by observing the device by a fluorescence microscope in an area of 2 mm². The results are shown in Table 2. The evaluation standards of the film property are given below.

A: Defects were observed in less than 10% of the area,
B: Defects were observed in less than 20% of the area, and
C: Defects were observed in 20% or more of the area.

The evaluation standards of the transfer ratio are given below, the transfer ratio meaning the ratio of the light-emitting organic layer transferred onto the electron-transporting organic layer.

A: Transfer ratio was 95% or more,
B: Transfer ratio was at least 80% and less than 95%, and
C: Transfer ratio was less than 80%.

The transfer of the light-emitting organic layer was repeated three times, and the displacement of the patterned organic layer in the resulting laminate B was evaluated by observing the laminate B by a fluorescence microscope in an area of 5 mm². The results are shown in Table 2. The evaluation standards of the displacement are given below.

A: Displacement was less than 0.02%,
B: Displacement was less than 0.1%, and
C: Displacement was 0.1% or more.

TABLE 2

| | Pressing | | | | | Displacement | | |
| Device No. | member No. | Thickness[1] (nm) | Rmax ratio[2] | Film property | Transfer ratio | Pressing member A | Pressing member B | Note |
| --- | --- | --- | --- | --- | --- | --- | --- | --- |
| 1 | 201 | 15 | 0.013 | A | A | A | A | Example |
| 2 | 202 | 40 | 0.013 | A | A | A | A | Example |

TABLE 2-continued

| Device No. | Pressing member No. | Thickness[1] (nm) | Rmax ratio[2] | Film property | Transfer ratio | Displacement Pressing member A | Displacement Pressing member B | Note |
|---|---|---|---|---|---|---|---|---|
| 3 | 203 | 100 | 0.13 | A | A | A | A | Example |
| 4 | 203 | 40 | 0.050 | A | A | A | A | Example |
| 5 | 203 | 40 | 0.025 | A | A | A | A | Example |
| 6 | 204 | 40 | 0.075 | A | A | A | A | Example |
| 7 | 205 | 15 | 0.47 | B | B | A | A | Example |
| 8 | 205 | 40 | 0.18 | A | A | A | A | Example |
| 9 | 206 | 40 | 0.075 | A | A | C | A | Example |
| 10 | 207 | 40 | 0.075 | A | A | C | B | Example |
| 11 | 208 | 40 | 6.25 | C | C | A | A | Comparative Example |
| 12 | 208 | 100 | 2.5 | C | C | A | A | Comparative Example |
| 13 | 209 | 40 | 1 | C | C | C | C | Comparative Example |
| 14 | 209 | 100 | 0.40 | B | C | C | C | Comparative Example |

Note
[1]Thickness of light-emitting organic layer.
[2]Ratio of maximum surface roughness Rmax of projection of pressing member to thickness of organic layer.

The organic electroluminescent devices of the present invention had low displacement of the pattern, excellent transfer ratios, and few defects.

EXAMPLE 2

Organic electroluminescent devices 21 to 34 were produced in the same manner as Example 1 except that transfer materials were produced by the following method of (H), respectively.

(H) Production of Transfer Material

A tris(2-phenylpyridine) iridium complex and 4,4'-N,N'-dicarbazole biphenyl were codeposited by a vacuum deposition method on the projection side of the pressing member 201 prepared in (A) to form a 15-nm-thick light-emitting organic layer, whereby a transfer material 221 was produced. The tris(2-phenylpyridine) iridium complex was deposited at a vapor deposition rate of 0.1 nm/second, and 4,4'-N,N'-dicarbazole biphenyl was deposited at a vapor deposition rate of 1 nm/second. Further, transfer materials 222 to 234 were produced in the same manner as the transfer materials 1002 to 1014 except for forming the light-emitting organic layer by the vacuum deposition method, respectively. As a result of observing the transfer materials 221 to 234 by a fluorescence microscope, the light-emitting organic layers were uniformly formed.

(I) Evaluation

Organic electroluminescent devices 21 to 34 produced by using the transfer materials 221 to 234 were observed and evaluated in the same manner as (G). The results are shown in Table 3.

TABLE 3

| Device No. | Pressing member No. | Thickness[1] (nm) | Rmax ratio[2] | Film property | Transfer ratio | Displacement Pressing member A | Displacement Pressing member B | Note |
|---|---|---|---|---|---|---|---|---|
| 21 | 201 | 15 | 0.013 | A | A | A | A | Example |
| 22 | 202 | 40 | 0.013 | A | A | A | A | Example |
| 23 | 203 | 100 | 0.13 | A | A | A | A | Example |
| 24 | 203 | 40 | 0.050 | A | A | A | A | Example |
| 25 | 203 | 40 | 0.025 | A | A | A | A | Example |
| 26 | 204 | 40 | 0.075 | A | A | A | A | Example |
| 27 | 205 | 15 | 0.47 | A | A | A | A | Example |
| 28 | 205 | 40 | 0.18 | A | A | A | A | Example |
| 29 | 206 | 40 | 0.075 | A | A | C | A | Example |
| 30 | 207 | 40 | 0.075 | A | A | C | B | Example |
| 31 | 208 | 40 | 6.25 | C | C | A | A | Comparative Example |
| 32 | 208 | 100 | 2.5 | C | C | A | A | Comparative Example |

TABLE 3-continued

| | Pressing | | | | | Displacement | | |
|---|---|---|---|---|---|---|---|---|
| Device No. | member No. | Thickness[1] (nm) | Rmax ratio[2] | Film property | Transfer ratio | Pressing member A | Pressing member B | Note |
| 33 | 209 | 40 | 1 | C | C | C | C | Comparative Example |
| 34 | 209 | 100 | 0.40 | B | C | C | C | Comparative Example |

Note
[1] Thickness of light-emitting organic layer.
[2] Ratio of maximum surface roughness Rmax of projection of pressing member to thickness of organic layer.

EXAMPLE 3

Organic electroluminescent devices were produced in the same manner as Example 1 except for adhering a laminate D produced by the following method to the laminates B.

(J) Production of Laminate D (Second Substrate/Anode/Hole-transporting Organic Layer)

A white glass plate, which had a size of 0.5 mm (thickness)×2.5 cm×2.5 cm, a linear thermal expansion coefficient of 4 ppm/° C. (measured by a TMA method at 20° C.), and a maximum surface roughness Rmax of 0.5 nm (according to JIS B 0601-1982), was placed in a vacuum chamber, and a 0.2-μm-thick, transparent ITO thin-film electrode was formed on the white glass plate by DC magnetron sputtering using an ITO target containing 10% by mass of $SnO_2$ (an indium/tin molar ratio 95/5) under the conditions of a white glass plate temperature of 250° C. and an oxygen pressure of $1 \times 10^{-3}$ Pa. The transparent ITO thin-film electrode of the resultant laminate had a surface resistance of 10Ω/square. Then, the transparent ITO electrode was connected to an aluminum lead wire. The white glass plate provided with the transparent ITO electrode was placed in a washing vessel, washed with isopropyl alcohol (IPA), and then subjected to an oxygen plasma treatment. The treated surface of the transparent ITO electrode was extrusion-coated with a coating liquid for a hole-transporting organic layer, and the applied coating liquid was dried at the room temperature to form a 40-nm-thick hole-transporting organic layer, so that the laminate D was produced. The coating liquid had a composition containing 40 parts by mass of a polymer PTPDES represented by the following formula:

10 parts by mass of an additive TBPA represented by the following formula:

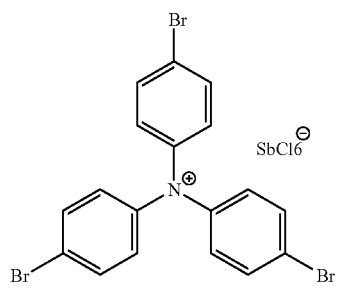

and 3,500 parts by mass of dichloroethane.

(K) Evaluation

The organic electroluminescent devices produced by laminating the laminate D to the laminates B respectively were observed by a fluorescence microscope. As a result, also the organic electroluminescent devices of the present invention had excellent transfer ratios and low displacement of the pattern as Example 1.

EXAMPLE 4

An organic electroluminescent device was produced in the same manner as Example 1 except that the light-emitting organic layer of the transfer material 1002 was transferred onto the laminate C as below, and that an electron-transporting organic layer and a cathode were formed on the transferred light-emitting organic layer by vapor deposition.

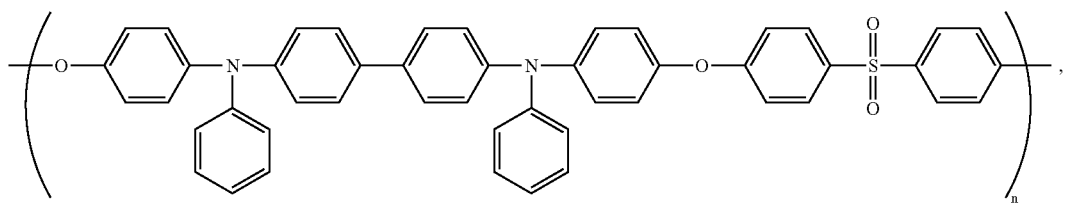

(L) Production of Laminate E (Second Substrate/Anode/Hole-transporting Organic Layer/Light-emitting Organic Layer)

The light-emitting organic layer of the transfer material 1002 was superposed on the hole-transporting organic layer of the laminate C (second substrate/anode/hole-transporting organic layer), a pressing member was superposed on the back surface of the transfer material 1002, and they were passed at a speed of 0.1 m/minute between a couple of heating rollers under a nip pressure of 0.3 MPa and a temperature of 160° C. The pressing member was then peeled from the transfer material 1002, so that a patterned light-emitting organic layer was formed on the hole-transporting organic layer to obtain a laminate E.

(M) Production of Organic Electroluminescent Device

An electron-transporting organic material represented by the following formula was vapor-deposited on the light-emitting organic layer of the laminate E to a thickness of 36 nm, LiF was vapor-deposited thereon to a thickness of 3 nm, and then Al was vapor-deposited thereon to a thickness of 250 nm to form a cathode. The cathode was connected to an aluminum lead wire to obtain an organic electroluminescent device.

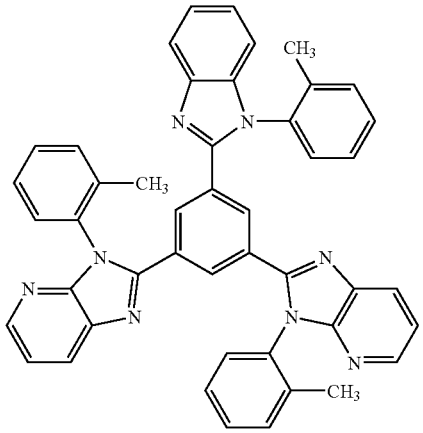

(N) Evaluation

The obtained organic electroluminescent device was observed by a fluorescence microscope and evaluated in the same manner as Example 1. As a result, the organic electroluminescent device had an excellent transfer ratio and low displacement of the pattern.

The method of the present invention can easily form a patterned organic layer on a substrate by the steps of forming an organic layer on a pressing member having a projection in a pattern to prepare a transfer material; superposing the transfer material on a substrate such that the organic layer faces the substrate; applying heat and/or pressure thereto to form a laminate; and peeling the pressing member from the laminate. In this method, a plurality of organic layers are not mixed at the interfaces therebetween, whereby the produced organic electroluminescent device is excellent in light-emitting efficiency and durability.

When the projection of the pressing member has a maximum surface roughness Rmax (according to JIS B 0601-1982) of at most 0.5 times the thickness of the organic layer, the organic layer is more efficiently transferred. Further, when the pressing member has a linear thermal expansion coefficient of 20 ppm/° C. or less, displacement of the patterned organic layer is reduced even in the case of finer patterning.

What is claimed is:

1. A method for producing an organic electroluminescent device by using a transfer material comprising a pressing member having projections and an organic layer formed on said projections, wherein said method comprises the steps of:
   superposing said transfer material on a first substrate having an electrode formed at least partially thereon such that said organic layer faces said electrode;
   applying pressure thereto to form a laminate; and
   peeling said pressing member from said laminate so that said organic layer is transferred onto said first substrate via said electrode, and applying a solution containing a monomer of a hardenable organic compound on the projection side of said pressing member and by polymerizing said monomer to form a flat layer between said projections and said organic layer and said flat layer consists of said hardenable organic compound.

2. The method of claim 1, wherein a top surface of said projections have a maximum surface roughness Rmax of at most 0.5 times the thickness of said organic layer according to Japanese Industrial Standard (JIS) B 0601-1982.

3. The method of claim 1, wherein said pressing member comprises a material having a linear thermal expansion coefficient of 20 ppm/° C. or less.

4. The method of claim 1, wherein said transfer material is produced by applying a coating liquid containing a compound for said organic layer to said pressing member, or by vacuum-depositing a compound for said organic layer onto said pressing member.

5. The method of claim 1, wherein after the transfer of said organic layer onto said first substrate via said electrode, a second substrate having an electrode formed at least partially thereon is laminated to said organic layer on said first substrate.

6. The method of claim 1, wherein said hardenable organic compound comprises one compound selected from the group consisting of an ultraviolet-curing organic compound, an electron beam-curing organic compound and a thermosetting organic compound.

* * * * *